(12) United States Patent
Salmon

(10) Patent No.: US 9,761,620 B1
(45) Date of Patent: Sep. 12, 2017

(54) METHOD AND SYSTEM FOR MANUFACTURING USING A PROGRAMMABLE PATTERNING STRUCTURE

(71) Applicant: Peter C. Salmon, Mountain View, CA (US)

(72) Inventor: Peter C. Salmon, Mountain View, CA (US)

(73) Assignee: Peter C. Salmon, LLC, Mountain View, CA (US)

( * ) Notice: Subject to any disclaimer, the term of this patent is extended or adjusted under 35 U.S.C. 154(b) by 0 days.

(21) Appl. No.: 15/269,690

(22) Filed: Sep. 19, 2016

(51) Int. Cl.
| | |
|---|---|
| H01L 21/46 | (2006.01) |
| H01L 21/4763 | (2006.01) |
| H01L 27/146 | (2006.01) |
| C23C 16/54 | (2006.01) |
| C23C 16/455 | (2006.01) |
| H01L 27/11578 | (2017.01) |
| G02F 1/1335 | (2006.01) |
| G03G 15/08 | (2006.01) |

(52) U.S. Cl.
CPC .... *H01L 27/1462* (2013.01); *C23C 16/45544* (2013.01); *C23C 16/545* (2013.01); *H01L 21/4763* (2013.01); *H01L 27/11578* (2013.01); *H01L 27/1464* (2013.01); *H01L 27/14614* (2013.01); *H01L 27/14632* (2013.01); *H01L 27/14636* (2013.01); *H01L 27/14643* (2013.01); *G02F 1/133516* (2013.01); *G03G 15/08* (2013.01)

(58) Field of Classification Search
None
See application file for complete search history.

(56) References Cited

U.S. PATENT DOCUMENTS

| | | | |
|---|---|---|---|
| 3,386,163 A * | 6/1968 | Brennemann | H01L 29/78 257/405 |
| 4,777,500 A | 10/1988 | Salmon | |
| 5,153,617 A | 10/1992 | Salmon | |
| 5,400,062 A | 3/1995 | Salmon | |
| 5,818,083 A * | 10/1998 | Ito | H01L 29/7883 257/321 |
| 6,309,049 B1 * | 10/2001 | Salmon | G03G 15/348 347/55 |
| 9,227,220 B1 | 1/2016 | Salmon | |

(Continued)

*Primary Examiner* — Binu Thomas
(74) *Attorney, Agent, or Firm* — Kilpartick Townsend & Stockton LLP

(57) ABSTRACT

A charge array wafer includes a plurality of electrical charge storage cells disposed in an array configuration. A programmable amount of charge in each of the electrical charge storage cells causes a predetermined electric field to extend from a charge storage layer, through a passivation layer and into the space above the passivation layer, and the predetermined electric field is operable to attract deposition material to the top surface of the passivation layer. The deposition material may be a gas, a liquid or a powder, having a minimum feature size ranging from tens of nanometers to around five microns. The array of electrical charge storage cells includes an uninterrupted two-dimensional array extending over greater than 100×100 electrical charge storage cells without a select gate and without a bit-line contact positioned between any of the electrical charge storage cells.

13 Claims, 26 Drawing Sheets

(56) References Cited

U.S. PATENT DOCUMENTS

| | | | |
|---|---|---|---|
| 2008/0036842 A1* | 2/2008 | Salmon | G03G 15/348 347/158 |
| 2009/0116288 A1* | 5/2009 | Varkony | G11O 5/145 365/185.13 |

* cited by examiner

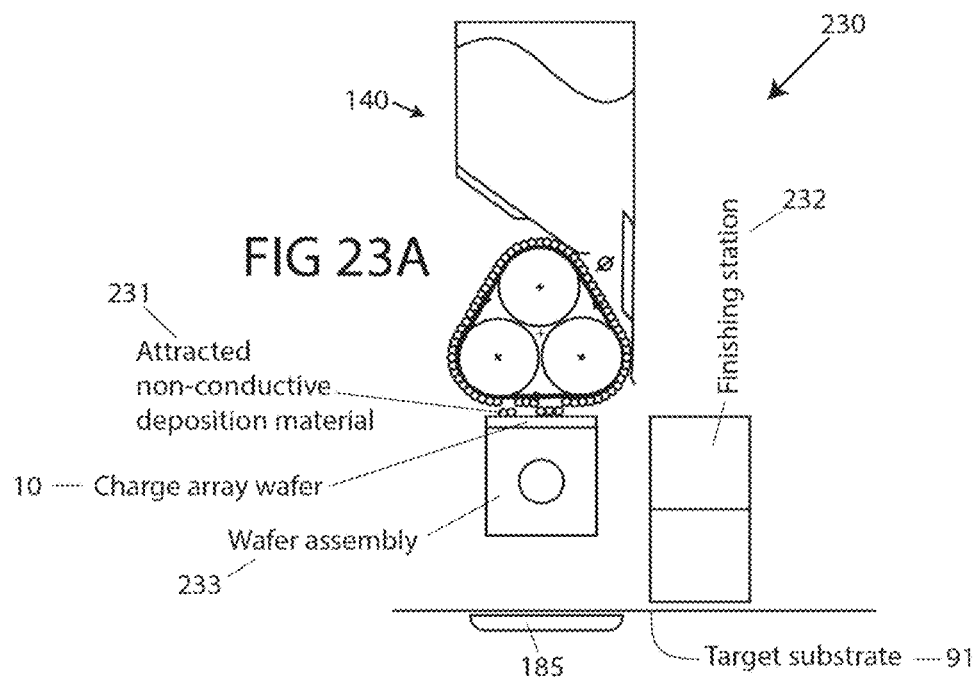
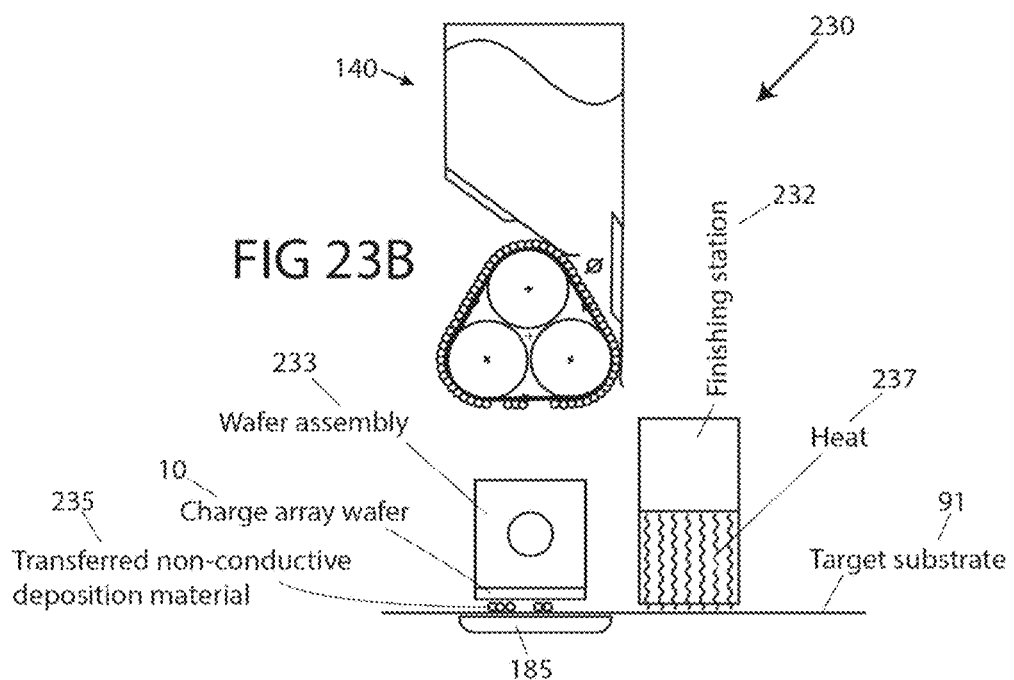

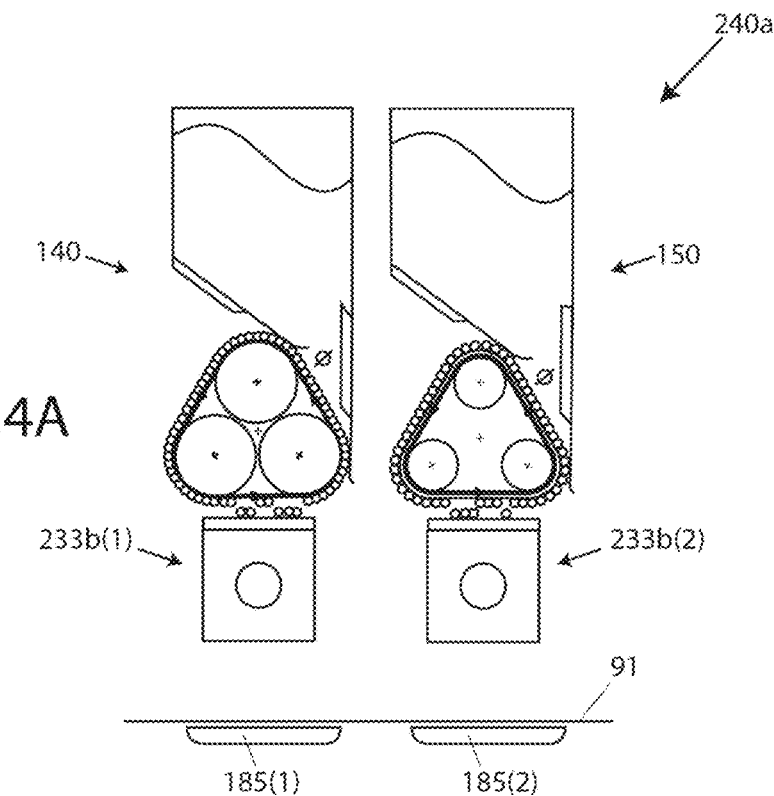
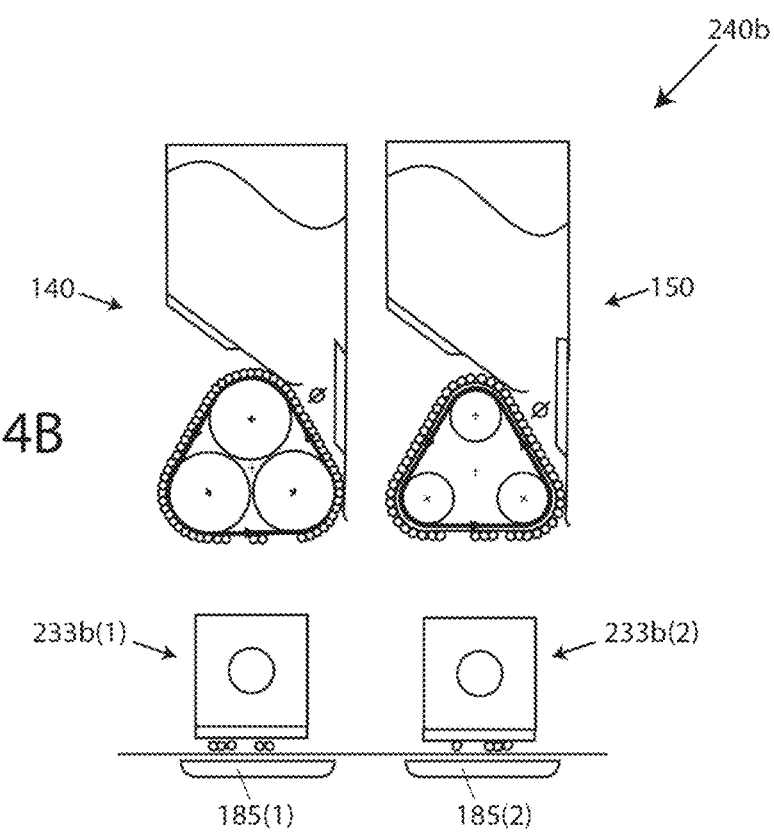

270

A method for creating a patterned layer of deposition material on a target substrate comprising:

271 — Provide a target substrate having substrate alignment features comprising embedded electrical charges;

272 — Provide a source of deposition material comprising electrically charged or bipolar particles;

273 — Provide a charge array wafer having programmable electrical charge storage cells for creating a predetermined charge image at a central portion of the wafer area, and also for creating predetermined wafer alignment features at the wafer periphery that match the substrate alignment features;

274 — Provide a protective circuit structure coupled to the electrical charge storage cells wherein a predetermined electrical field coupled to the predetermined charge image penetrates the top surface of the charge array wafer;

275 — Provide a transfer unit;

276 — Present the charged or bipolar particles to the top surface of the charge array wafer;

277 — Attract the charged particles to the top surface of the charge array wafer in accordance with the predetermined charge image;

278 — Position the top surface of the charge array wafer adjacent the top surface of the target substrate in approximate alignment;

279 — Align the top surface of the target substrate to the top surface of the charge array wafer in precision alignment using the substrate alignment features and the matching wafer alignment features;

280 — Transfer the attracted charged or bipolar particles from the top surface of the charge array wafer to the top surface of the target substrate using the transfer unit, wherein the charged particles are transferred in accordance with the predetermined charge image; and, 281 — Fuse the transferred particles to the target substrate, in accordance with the predetermined charge image;

A method for aligning two opposing substrates comprising:

↓ 291

Provide a first substrate having substrate alignment features comprising first embedded electrical charges in a first pattern;

↓ 292

Provide a second substrate having substrate alignment features comprising second embedded electrical charges in a second pattern matching the fist pattern, except for having opposite electrical polarities to the first embedded electrical charges;

↓ 293

Align the first and second substrate to a first alignment accuracy using a mechanical transport system, wherein a loose draping allows small local movements between the first and second substrate;

↓ 294

Provide a modulating electrode;

↓ 295

Position the modulating electrode underneath the second substrate;

↓ 296

Connect an AC voltage to the modulating electrode, in series with any applied DC voltage;

↓ 297

Determine the total force of steady state adhesion between the first and second substrates, at the point in time when precision alignment is desired;

↓ 298

Control the AC voltage as a decaying sinusoid to provide a modulated lateral alignment force between the first and second substrates, wherein the amplitude of the sinusoidal waveform is sufficient to provide a modulated lateral alignment force that in the initial cycles overcomes the value determined for the steady state adhesion, including any stiction; and,

↓ 299

Align the first and second substrates to a second alignment accuracy higher than the first alignment accuracy using the substrate alignment features and the modulated lateral alignment force.

FIG 28

METHOD AND SYSTEM FOR MANUFACTURING USING A PROGRAMMABLE PATTERNING STRUCTURE

BACKGROUND OF THE INVENTION

Methods have been developed for patterning materials on substrates. For example, photolithography employs photoresist and a shadow mask. Light passes through the shadow mask and selectively exposes the photoresist. The exposed photoresist is then developed and cured to create a patterned photoresist. To define the underlying material according to the photoresist pattern, an etchant can be employed to remove material where the photoresist is absent. Alternatively, materials can be deposited on the photoresist and patterned by a lift-off process. In this case, the deposited material is removed where the photoresist is present. Additionally, some semiconductor processing materials have been developed with photo-active properties, providing a dielectric material that can be patterned like photoresist; an example is benzocyclobutene (BCB).

Despite the progress made in photolithography and other patterning techniques, there is a need in the art for improved methods and systems for patterning materials.

SUMMARY OF THE INVENTION

The present invention relates generally to apparatus for patterning materials on a substrate. More particularly, embodiments provide methods and systems that include programmable charge storage cells in a wafer level imaging array suitable for patterning materials on a substrate.

According to an embodiment of the present invention, a charge array wafer is provided. The charge array wafer includes a support wafer having a backside and including a plurality of electrical charge storage cells disposed in an array configuration and above the backside. Each of the plurality of electrical charge storage cells includes a charge storage layer disposed in a first plane positioned at a first distance from the backside and a passivation layer coupled to the charge storage layer and disposed in a second plane positioned at a second distance from the backside greater than the first distance. The passivation layer has a bottom surface coupled to the charge storage layer and a top surface opposite the bottom surface. The top surface of the passivation layer is operable to receive deposition materials. Each of the plurality of electrical charge storage cells is programmable to create a predetermined electric field extending from the charge storage layer through the top surface of the passivation layer. The charge array wafer also includes a plurality of addressing nodes coupled to the support wafer and electrical interconnects connecting the plurality of addressing nodes to the plurality of electrical charge storage cells.

According to some embodiments, each of the plurality of electrical charge storage cells comprises a floating gate. The charge array wafer can also include a plurality of circumferentially arrayed electrical charge storage cells peripherally surrounding the plurality of electrical charge storage cells. The circumferentially arrayed cells can be configurable as alignment features. The plurality of electrical charge storage cells can be utilized as a programmable imaging array comprising pixels including one or more of the electrical charge storage cells. The pixel size can be varied under software control. In an embodiment, the charge array wafer further includes a plurality of through wafer vias disposed at a periphery of the charge array wafer. Additionally, the charge array wafer can include one or more protective or special function layers disposed in a third plane positioned at a third distance from the backside greater than the second distance.

In an embodiment, the select gate controls access to more than 100 cells connected on a bit line, for example, more than 1,000 cells connected to the bit line. The charge array wafer can include an array configuration in which the electrical charge storage cells are disposed in an array configuration to define a uninterrupted two-dimensional array extending over greater than 100×100 cells. The uninterrupted two-dimensional array can be free of a select gate positioned between any of the electrical charge storage cells.

According to a specific embodiment of the present invention, a charge array wafer for use in an in-line deposition module includes a controller coupled to the charge array wafer. The charge array wafer includes a first plurality of electrical charge storage elements configurable as a wafer level programmable imaging array. Each of the plurality of electrical charge storage elements includes a charge storage layer disposed in a first plane positioned at a first distance from a backside of the wafer and a passivation layer coupled to the charge storage layer and disposed in a second plane positioned at a second distance from the backside greater than the first distance. The passivation layer has a bottom surface coupled to the charge storage layer and a top surface opposite the bottom surface. The top surface of the passivation layer is operable to receive deposition materials. The in-line deposition module also includes a source of polar or electrically-charged deposition material disposed adjacent the charge array wafer, a target substrate positioned to oppose the charge array wafer, and a transfer electrode. The charge array wafer and the transfer electrode are disposed on opposing sides of the target substrate.

In an embodiment, the charge array wafer is characterized by a thickness ranging from about 10 μm to about 50 μm, which can be utilized, for example, in a patterning web implementation.

According to a particular embodiment of the present invention, a manufacturing system is provided. The manufacturing system includes a plurality of in-line deposition modules. Each of the plurality of in-line deposition modules includes a source of polar or electrically-charged deposition material, a transfer electrode, and a charge array wafer comprising a plurality of electrical charge storage elements. The charge array wafer is configurable as a wafer level imaging array. Each of the plurality of electrical charge storage elements includes a charge storage layer disposed in a first plane positioned at a first distance from a backside of the wafer and a passivation layer coupled to the charge storage layer and disposed in a second plane positioned at a second distance from the backside greater than the first distance. The passivation layer has a bottom surface coupled to the charge storage layer and a top surface opposite the bottom surface. The top surface of the passivation layer is operable to receive deposition materials. The manufacturing system also includes a target substrate operable to be positioned below each of the plurality of in-line deposition modules.

According to another embodiment of the present invention, a first sealed chamber can be provided surrounding one or more deposition modules. Additionally, a second sealed chamber can be provided surrounding the first sealed chamber. In one implementation, a vacuum chamber can be utilized that encloses a plurality of the in-line deposition modules.

According to yet another embodiment of the present invention, a method of forming a patterned device is provided. The method includes providing a charge array wafer including a plurality of electrical charge storage cells disposed in a two-dimensional array, programming the plurality of electrical charge storage cells to define a first predetermined charge image, and depositing a first material using the charge array wafer. The deposition material can be patterned in accordance with a wafer level programmable imaging array, thereby transferring an image formed on the wafer-level programmable imaging array to a target substrate using a transfer unit. As an example, the plurality of electrical charge storage cells can be programmed to form a charge image.

In some embodiments, the charge image is operable to attract a deposition material that is electrically bipolar or electrically charged. The attracted deposition material is disposed in image formation on the charge array wafer in accordance with the charge image. The deposition material may include a gas, a liquid, or a powder. The method may maintain alignment using matching alignment features while both the patterning web and the target substrate are in motion. In some implementations, the alignment may be maintained during operation with an overlay accuracy of five µm or less. In addition to patterning, embodiments of the present invention may provide additional processing functionality including physical or chemical processing, irradiation, heating, creation of a conforming layer, or the like. Patterning and/or processing may be performed at ambient pressure or at reduced pressures, including vacuum pressures. Patterning and/or processing may be performed in air, a gas ambient other than air, or a vacuum environment. Using embodiments of the present invention, it is possible to create a patterned layer of conductive, resistive, dielectric, magnetic, optical or semiconductor material. Additionally, embodiments can be used to create a patterned layer having a minimum feature size of five µm or less. As an example, a patterned layer of semiconductor material can be used to support the creation of an active device. Additionally, embodiments can be used to produce a conforming layer in a form reactive with some or all of the underlying layers on the target substrate.

According to an embodiment of the present invention, a patterning web is provided. The patterning web includes a flexible substrate and a plurality of thinned charge array wafers mounted on the flexible substrate. Each of the plurality of thinned charge array wafers includes a first plurality of electrical charge storage elements configurable as a programmable wafer level imaging array. The patterning web can be configured to accept deposition material in the form of a gas, a liquid, or a powder. Each charge array wafer can include terminals and conductive traces and the flexible substrate can include corresponding terminals and conductive traces. Additionally, the patterning web can include one or more protective or special purpose coatings for use in a manufacturing system.

According to another embodiment of the present invention, a miniaturized deposition module is provided. The miniaturized deposition module includes a source of electrically bipolar or charged deposition material and a charge array wafer mounted on a mechanically rotatable and translatable assembly. The charge array wafer includes a two-dimensional array of charge storage cells that can be programmed to create a predetermined charge image in accordance with a desired pattern of deposition material, and embedded wafer alignment features comprising electrical charges. The miniaturized deposition module also includes a target substrate comprising substrate alignment features that correspond with the wafer alignment features. The substrate alignment features further comprise embedded electrical charges. The miniaturized deposition module further includes a transfer electrode and may or may not include a finishing station.

During operation of the miniaturized deposition module, the charge array wafer is first positioned near the source of deposition material and electrically charged or bipolar deposition material is attracted to suitably programmed cells of the charge array wafer. The charge array wafer is then positioned in approximate local alignment with the target substrate using the mechanically rotatable and translatable assembly. The charge array wafer is subsequently positioned in precise local alignment with the target substrate using the embedded wafer alignment features operating in cooperation with the substrate alignment features. The attracted deposition material is transferred to the target substrate at the transfer electrode. The transferred material is fused to the target substrate in accordance with the predetermined charge image using heat that may be provided by a heater disposed in the mechanically rotatable and translatable assembly together with heat that may be provided by a heated transfer electrode, or the heat may be provided by the finishing station.

According to another particular embodiment of the present invention, a miniaturized roll-to-roll manufacturing system is provided. The miniaturized roll-to-roll manufacturing system includes a series of miniaturized in-line deposition modules. Each module includes a source of electrically bipolar or charged deposition material, a charge array wafer mounted on a mechanically rotatable and translatable assembly. The charge array wafer includes a two-dimensional array of charge storage cells that can be programmed to create a predetermined charge image in accordance with a desired pattern of deposition material and embedded wafer alignment features comprising electrical charges. The miniaturized roll-to-roll manufacturing system also includes a target substrate comprising substrate alignment features that correspond with the wafer alignment features. The substrate alignment features further comprise embedded electrical charges. The miniaturized roll-to-roll manufacturing system further includes a transfer electrode and may include a finishing station in one or more of the in-line deposition modules.

During operation of the miniaturized roll-to-roll manufacturing system, the charge array wafer is first positioned near the source of deposition material and electrically charged or bipolar deposition material is attracted to suitably programmed cells of the charge array wafer. The charge array wafer is second positioned in approximate local alignment with the target substrate using the mechanically rotatable and translatable assembly. The charge array wafer is further positioned in precise local alignment with the target substrate using the embedded wafer alignment features operating in cooperation with the substrate alignment features and the attracted deposition material is transferred to the target substrate at the transfer electrode. The transferred material is fused to the target substrate in accordance with the predetermined charge image using the finishing station.

According to embodiments of the present invention, apparatus for fabricating electronic devices are provided. More specifically, components and systems for depositing a patterned material on a substrate are provided by the embodiments described herein. In particular, patterned layers may be produced using programmable charge storage cells. The patterning process may be understood via its similarity to Xerography, wherein a charge image created on a photoconductive drum is developed with toner, and the resulting toner image is transferred to a print substrate. The term "charge image" is well known to practitioners of electrophotography, where it is typically described as a "latent charge image."

In embodiments of the present invention, the charge image is created by programming the cells of a charge array wafer, described more fully below. Instead of toner, a deposition material is utilized in some implementations that is either electrically charged or electrically bipolar. This deposition material may be used to create a patterned layer of conductive, resistive, dielectric, magnetic, optical, or semiconductor material on a target substrate.

In alternative embodiments, the target substrate may be thin or thick, flexible or rigid, opaque or transparent. Certain embodiments of the present invention enable patterning of materials on substrates at standard room pressure, i.e., not requiring a vacuum. Process environments may also include a gas mixture or a vacuum. Merely by way of example, the invention can be applied to flexible printed circuits (FPCs), generally including multiple patterned layers. The FPCs may include embedded passives, and also may be extended to hybrid electronic systems (HESs) in which thinned semiconductor chips are attached to a flexible target substrate. If the target substrate is rigid, the semiconductor chips may not require thinning.

Certain embodiments of FPCs described herein may be further extended to incorporate semiconductor layers that can lead to active devices that are patterned using the programmable charge storage cells. An example structure is described for a thin film transistor, TFT. Thus, a product produced by the apparatus provided by embodiments of the present invention may be a complete electronic system including both active and passive components together with interconnections between them. Embodiments of the present invention provide systems that have a compact size, a low weight, and optionally, a rolled-up form factor. Embodiments achieve device production at a lower fabrication cost and with a shorter turn-around time than can be achieved using current systems. In some implementations, interconnects having a resolution intermediate between that achieved in semiconductor chips and in conventional printed circuit boards (PCBs) are utilized. One of ordinary skill in the art would recognize many variations, modifications, and alternatives.

According to an embodiment of the present invention, a charge array wafer is provided that includes programmable charge storage cells that can be used to create a charge image. A circuit structure is provided so that the charge image results in an electric field image that projects upward from the top surface of the charge array wafer. When an electrically charged or electrically bipolar deposition material is exposed to the electric field image, by presenting particles of the material close to the top surface of the charge array wafer, the charged or bipolar particles are attracted to form a patterned layer in accordance with the electric field image. Since there is a one-to-one relationship between the charge image and the electric field image, the patterned layer is also in accordance with the charge image. The force on a charged particle is qE, where q is the net charge on the particle and E is the electric field. For a distributed charge and a varying field, the total force of attraction is the sum over all the elemental charges in or on the particle, $\Sigma q_i E_i$, where $q_i$ is an elemental charge and $E_i$ is the field "seen" by the particle. The attracted material is electrostatically transferred to a target substrate using a transfer electrode, and again, the transferred material is in accordance with the charge image. The process is additive and uses a reduced amount, for example, a minimum amount, of deposition material. Alteration of the structure that is being printed can be accomplished using only a software reload, rather than the changing of a printing plate or cylinder.

In a manufacturing system including multiple deposition modules, each deposition module may be used to create a patterned layer continuously in a roll-to-roll configuration. Additionally, the deposition module may be used to deposit materials on planar substrates. Each deposition module is optionally equipped with a finishing module, capable of further configuring a deposited layer through the use of physical or chemical interactions, heat, or irradiation, or application of a coating. Accurate alignment of stacked layers is provided via a process of active registration using charged alignment features, to be further described. Since the manufacturing system can be reprogrammed in minutes using software, an agile manufacturing system is produced that can be cost-effective for short or long production runs, and produce new designs with a short turn-around time.

According to an embodiment of the present invention, a charge array wafer is provided. The charge array wafer includes a first plurality of electrical charge storage cells, configurable as a programmable wafer level imaging array. The programmed first plurality of electrical charge storage cells comprises a charge image. In an embodiment, the charge image is operable to attract deposition material that is electrically bipolar or electrically charged, with the attracted deposition material disposed in image formation in accordance with the latent image. The deposition material may comprise a gas, a liquid, or a powder as non-limiting examples. Each of the first plurality of electrical charge storage cells may comprise a floating gate for storing the electrical charge, and the design of the charge storage cells may be adapted from existing flash memory cells. The charge array wafer may further comprise a second plurality of charge storage cells configurable as alignment features. The programmable imaging array can include charge storage cells having an edge dimension, and imaging pixels whose size can be any multiple of the edge dimension, achieved via software control. The charge array wafer may further comprise through wafer vias in order to make electrical connections to circuits on the wafer without interfering with imaging operations occurring at the front side of the wafer. The through wafer connections may also take advantage of the surface tension of molten solder to assist in the alignment of the wafer to other surfaces to which it may be electrically connected. The wafer may also comprise one or more protective or special purpose layers, for use in a manufacturing system.

According to another embodiment of the present invention a patterning web is provided, including a flexible substrate on which a plurality of thinned charge array wafers is mounted. The charge array wafers are described above. The patterning web may further include electrical charges embedded in the flexible substrate, for use as alignment features. These charges may be embedded in charge storage cells, or alternatively may be embedded using ion implanting equipment. Accordingly, in one preferred embodiment the patterning web includes a second plurality of programmable charge storage cells that are configurable for use as alignment features. In another preferred embodiment, the patterning web includes alignment features comprising electrical charges that have been implanted using high energy beams. Each charge array wafer can include terminals and conductive traces and the flexible substrate of the patterning web can include corresponding terminals and conductive traces, for electrically programming each of the first and second pluralities of programmable charge storage cells using circuitry external to the patterning web. The patterning web may additionally comprise one or more protective or special purpose coatings for use in a manufacturing system.

According to another embodiment of the present invention, an in-line deposition module is provided. This module includes a target substrate, a source of polar or electrically charged deposition material, a patterning web as described above, a plurality of charge array wafers as described above, and a transfer unit, wherein the electrically charged deposition material is patterned in accordance with the programmable imaging array and transferred in image formation from the patterning web to the target substrate at the transfer unit. The in-line deposition module may further include matching alignment features in the patterning web and in the target substrate. The matching alignment features can include electrical charges. The in-line deposition module is operable to maintain alignment using the matching alignment features while both the patterning web and the target substrate are in motion, for example, with an overlay accuracy of five μm or less. The deposition module optionally comprises a finishing unit, wherein the deposition material transferred to the target substrate in image formation may be additionally processed by the finishing unit. The conditional additional processing may comprise physical or chemical processing, or irradiation, or heating, or creation of a conforming layer. Physical conditioning may include brushing or rolling as non-limiting examples.

The deposition module is configurable to operate at ambient pressure, or in a gas ambient other than air, or in a vacuum. The deposition module is further configurable to create a patterned layer of conductive, resistive, dielectric, magnetic, optical, or semiconductor material, and a patterned layer will preferably have a minimum feature size of five micrometers or less. The patterned layer of semiconductor material is configurable to support the creation of an active device. A conforming layer produced by the deposition module may be in a form reactive with one or more of the underlying layers of the target substrate.

According to another embodiment of the present invention, a manufacturing system is provided. The manufacturing system comprises a target substrate and a plurality of in-line deposition modules as described above. In one preferred embodiment the manufacturing system is configured to move the target substrate through the plurality of in-line deposition modules in a roll-to-roll manner. Additionally, it is preferred that the target substrate be disposed in a straight line, for simplicity of the various support equipment and interfaces. In another preferred embodiment the manufacturing system is configured to accept planar substrates. The manufacturing system is configurable to operate at either ambient pressure or in a vacuum, and this choice may depend on the reactivity in air of a chosen deposition material. However, nitrogen or hydrogen or other gases or gas mixtures may be employed within an in-line deposition module to allow deposition of high quality materials that would otherwise react in air. The manufacturing system is configurable to create at least one patterned layer having a minimum feature of five micrometers or less, such a result being intermediate between the feature sizes achievable in a current generation semiconductor chip and in a current generation printed wiring board, wherein each charge array wafer comprises a plurality of charge storage cells.

Numerous benefits can be achieved by way of certain embodiments of the present invention over conventional techniques. For example, low cost fabrication of patterned substrates may be achievable using a roll-to-roll process at ordinary atmospheric pressure. Thus, the cost of fabricating layered circuits on a substrate can be dramatically reduced using roll-to-roll processing instead of batch processing. Utilizing certain embodiments of the present invention, multiple patterned layers may be deposited in sequence, to provide a complete flexible printed circuit. The range of achievable circuits may be expanded by developing a comprehensive range of compatible deposition materials. Indeed, the circuit produced need not be an electronic circuit; it may, for example, be a painting or an expression of art; it may have relief features to create a three-dimensional product.

Additionally, embodiments of the present invention can be used to create a three-dimensional component including multiple printed layers. Utilizing the programmability of the charge array wafers, agile production processes can be developed with short setup times, short run times, and low unit costs for both short and long production runs. Moreover, turn-around time for electronic circuits and other constructions can also be substantially reduced using the proposed electronic programmability of the various components of a manufacturing system. The degree of process automation and the associated process yields can potentially be increased because of a unified flow of materiel among other factors. These and other embodiments of the invention along with many of its advantages and features are described in more detail in conjunction with the text below and attached figures.

BRIEF DESCRIPTION OF THE DRAWINGS

FIG. 23A is a schematic side view of a miniaturized deposition module for depositing non-conductive deposition material on a target substrate, according to an embodiment of the present invention.

FIG. 23B is a schematic side view of the miniaturized deposition module of FIG. 23A, showing the positioning of a charge array wafer assembly during transfer, according to an embodiment of the present invention.

FIG. 24A is a schematic side view of a pair of miniaturized deposition modules for depositing conductive deposition material on a target substrate, according to an embodiment of the present invention.

FIG. 24B is a schematic side view of the pair of miniaturized deposition modules of FIG. 24A, showing the positioning of the charge array wafer assemblies during transfer and fusion, according to an embodiment of the present invention.

FIG. 27 is a flow chart of a manufacturing method, according to an embodiment of the present invention.

FIG. 28 is a flow chart describing an alignment method, according to an embodiment of the present invention.

DETAILED DESCRIPTION OF SPECIFIC EMBODIMENTS

Figure 1A:
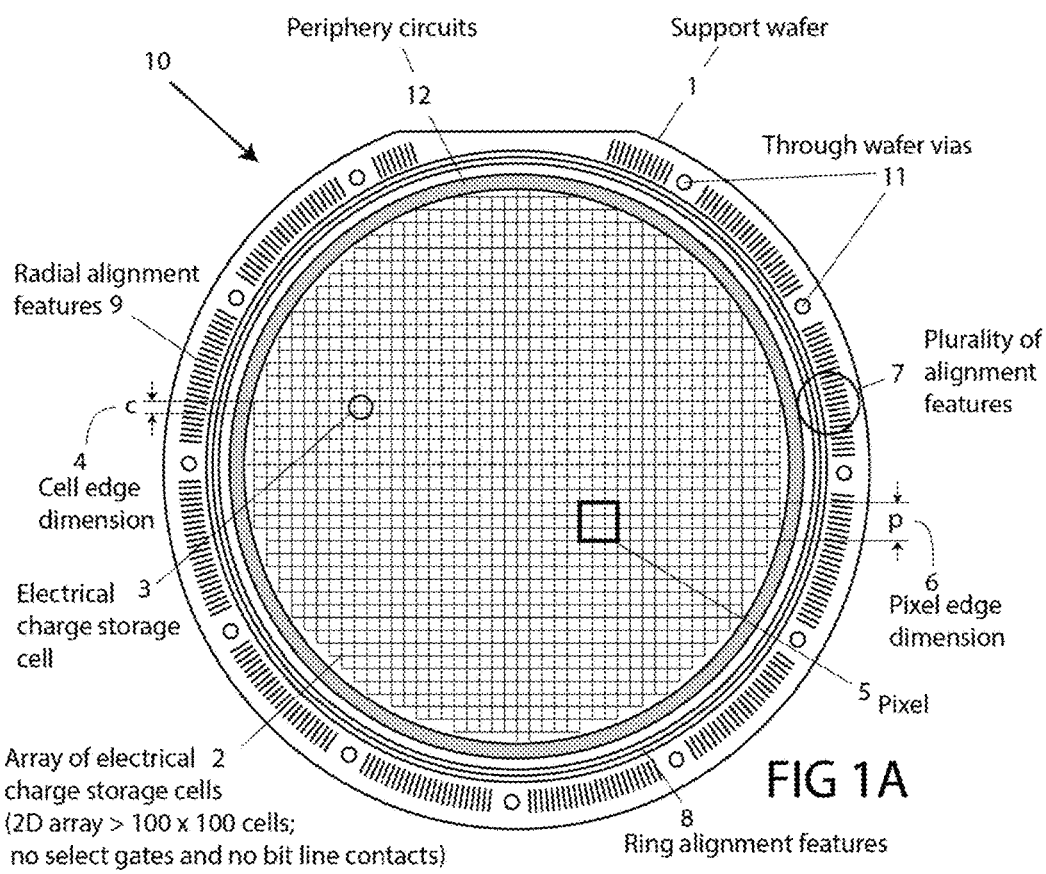
FIG. 1A is a plan view of an exemplary charge array wafer according to an embodiment of the present invention.

Embodiments of the present invention relate to methods and apparatus for patterning deposition materials on a substrate, wherein the pattern for each deposition layer can be electronically defined by writing to an array of charge storage cells.

Existing fabrication processes can be used to inform variations in the apparatus and methods of the present invention. For example, in addition to the photolithography processes discussed above, seed layers have been used to pattern materials. A thin seed layer can be patterned, then plated up to create a thicker layer. This process has been utilized with copper as the deposition material, for example in the fabrication of printed wiring boards (PWBs). Methods for etching deposited films include wet etching in a bath of etchant, dry etching using a plasma process in a vacuum, or sputter etching. Such methods can be adapted for use in manufacturing systems of the present invention, wherein the use of charge array wafers provides opportunities for software configuration of the processes, as well as opportunities for increased automation.

In addition to deposition on substrates, attempts have been made in the area of low cost fabrication of patterned substrates using roll-to-roll processing. Using these methods, film materials may be deposited on a moving flexible substrate. Some applicable processes such as ink jet printing may be conducted at atmospheric pressure. However, higher quality films may be produced under vacuum. For fabrication of films requiring vacuum processing, a source roll on which the flexible substrate is wound may be moved into a vacuum system for processing, and a take-up roll containing the processed film may be removed when processing is complete. Inside the vacuum chamber the flexible substrate may move serially through multiple processing stations. However, such vacuum systems tend to be expensive, and the parts produced may have a higher fabrication cost than desired. A miniaturized R2R fabrication system will be described, wherein the requirement for vacuum processing will be less burdensome, because the vacuum envelope is reduced in size.

Accordingly, embodiments of the present invention provide roll-to-roll systems for fabricating high quality patterned films on substrates at atmospheric pressure (e.g., without any vacuum required). As a result, embodiments of the present invention are amenable to automation and have the potential for low fabrication cost. Furthermore, embodiments of the present invention provide agile manufacturing systems that are electronically programmable with regard to the desired patterns of the constituent layers of a multi-layer product. These agile systems can have short turn-around times for the production of products with variable patterning requirements and are cost effective for short production runs as well as for long production runs.

U.S. Pat. No. 9,227,220 issued to Salmon on Jan. 5, 2016 describes a method for patterning materials on a substrate in which a production line may be configured in a roll-to-roll manner.

Flash memory cells have been developed, wherein electrical charges are stored for periods of decades. The cells have read/write capability. Many of them employ a floating gate structure for storing the electrical charge.

Hybrid electronic systems (HESs) have also been developed, wherein thinned semiconductor chips are attached to flexible substrates and the resulting assembly is flexible like a flexible printed circuit (FPC). For this purpose, processes have been developed for thinning semiconductor wafers to a thickness of around 25 µm for example.

An embodiment of the present invention employs programmable charge storage cells that have been adapted for use as patterning elements. The patterning elements correspond to pixels in an image wherein the pixel size is programmable by software, and a patterned layer of deposition material is created on a target substrate in image formation, in accordance with the charge image created by a predetermined programming of the charge storage cells.

Embodiments of the present invention enable a coarse alignment of layers using mechanical means, plus a fine alignment enabled by electrically charged features. The fine alignment can operate over short distances corresponding to individual circuits. This alignment is operable while the target substrate is either paused in a stationary position, or in motion while it is moving through the patterning process. Since coulomb forces provide a continuous restoring force, this technique for maintaining precision alignment between potentially moving substrates may be described as "active alignment" or "dynamic alignment" or "active registration". The technique will be described herein as "active registration".

FIG. 1A depicts an exemplary charge array wafer 10 according to an embodiment of the present invention. Charge array wafer 10 is fabricated on a support wafer 1 comprising a semiconductor material. In the embodiment illustrated in FIG. 1A, charge array wafer 10 includes an array 2 of electrical charge storage cells 3, which is a two-dimensional array comprising greater than 100×100 electrical charge storage cells, arranged in an uninterrupted manner with no select gates and no bit line contacts positioned between any of the charge storage cells. Electrical charge storage cells 3 are shown with an edge dimension c, 4. A pixel 5 is also shown, having a pixel edge dimension p, 6. Edge dimension p, 6 is equal to n times edge dimension c, 4, where n is an integer equal to or greater than 1. A pixel is defined as the minimum sized imaging element for depositing materials on charge array wafer 10, and its size can be adjusted in software to optimize imaging considerations for a particular deposition material and/or a particular pattern of the deposition material. In FIG. 1A a plurality of alignment features 7 is shown, comprising ring alignment features 8 and radial alignment features 9. In the embodiment illustrated in FIG. 1A, charge array wafer 10 includes through wafer vias, TWVs, 11, which may be used as terminals to address the charge storage cells on wafer 10. TWVs 11 provide precision alignment of points on the back side of the charge array wafer with respect to corresponding points on the front side of the wafer, they may also provide means to achieve precise alignment of the charge image produced on the front side of wafer 10 with other components that are connected at the backside of charge array wafer 10, including a wafer assembly to which charge array wafer 10 may be mounted. TWVs 11 provide a satisfactory means to make electrical connections to the charge storage cells 3 on charge array wafer 10, without interfering with imaging activity that may be taking place at the top side of charge array wafer 10. Periphery circuits 12 are also shown, comprising addressing and logic circuits for programming electrical charge storage cells 3 with varying amounts of electrical charge, the amount of charge varies according to a software program.

Figure 1B:
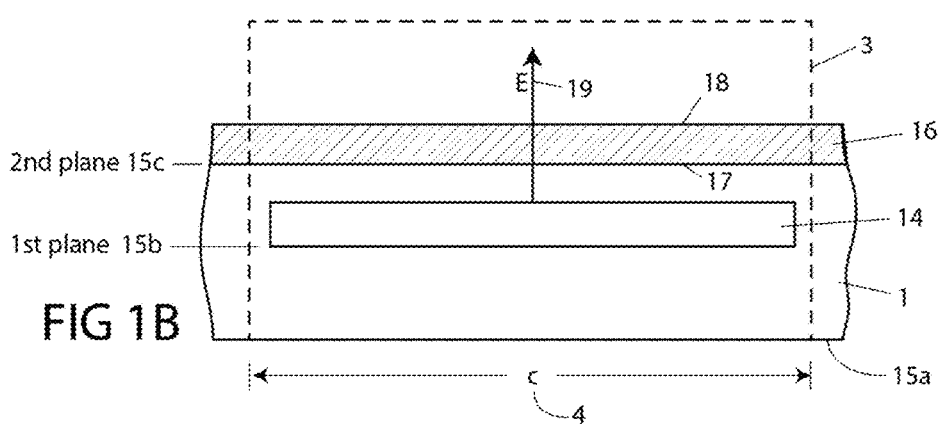
FIG. 1B is an enlarged cross-sectional view of an electrical charge storage cell depicted in FIG. 1A.

FIG. 1B illustrates a single electrical charge storage cell comprising a charge storage layer 14 disposed in a first plane 15b positioned at a first distance from back side 15a of support wafer 1. Also shown is a passivation layer 16 coupled to the charge storage layer 14 and disposed in a second plane 15c positioned at a second distance from back side 15a, the second distance greater than the first distance. Passivation layer 16 has a bottom surface 17 coupled to charge storage layer 14 and a top surface 18 opposite the bottom surface 17. Top surface 18 is operable to receive deposition materials. Various material layers may be used in combination with passivation layer 16 to optimize the patterning of deposition materials. Each electrical charge storage cell 3 is programmable to create a predetermined electric field 19 extending from charge storage layer 14 through top surface 18 of passivation layer 16. Electric field 19 is created in the space above charge array wafer 10, and is used to pattern deposition particles that are electrically charged or electrically bipolar. The deposition particles may comprise a gas, a liquid or a powder, and may include particles ranging in size from tens of nanometers to around 5 µm. Many different types of circuit may be used to create charge storage layer 3 in an electronically programmable manner, including a NAND flash memory circuit, further described in reference to FIGS. 2 through 7B.

As described herein, embodiments of the present invention provide accurate alignment of the charge array wafers to features of a patterning web, or to features of a charge array wafer assembly, and the accurate alignment is desirable for reducing or minimizing potential alignment errors between each charge array wafer and the target substrate. In turn, this contributes to a satisfactory overlay accuracy between sequentially deposited layers on the target substrate.

Referring to FIG. 1A, electrically charged ring alignment features 8 are shown at the periphery of charge array wafer 10, along with similarly charged radial alignment features 9. Ring alignment features 8 will serve to position the center of the charge array wafer correctly, and radial alignment features 9 will serve to position the charge array wafer with the correct angular orientation. In the interior of charge array wafer 10, covering most of its area in some implementations, an array 2 of electrical charge storage cells 3 is provided. At the periphery of this array is a region of periphery circuits 12, including electronic circuits to address the charge storage cells 3, and program them with desired levels of charge. The design of the charge storage cells may be adapted from existing flash memory cells; they may employ floating gate structures for storing the charge, and this may enable endurance measured in years for the charge stored in these elements. Other memory cell or electrical charge storage architectures may also be used. A NAND structure is described as an option for connecting the cells for read/write/erase purposes. However, other circuit configurations may be used.

The cell edge dimension c, 4 of each charge storage cell may be around 1 μm for example, although smaller and larger side dimensions may be employed. This defined geometry enables pixels to be defined in software with a pixel edge dimension p, 6 comprising any convenient multiple of the edge dimension of a charge storage cell, which in this case is 1 μm. Additionally, in the layout of charge array wafer 10, the effective aperture for the electric field emanating from a charged cell is an important consideration. The electric field projects upward from each cell and may be screened by metal interconnects. Accordingly, metal interconnect lines placed above charge storage cells may either be eliminated, or alternatively minimized in some embodiments, for example by using narrow metal line widths.

The size of desired deposition material particles, including molecules, may be used to inform the choice of a suitable side dimension for the charge storage cells. For example, for spherical deposition particles having a diameter of 5 μm, a side dimension of 1 μm may allow for single cell defects to be accommodated in a manufacturing system. 5 μm particles comprising spheres of solder and also spheres of dielectric material will be further described. Deposition materials may also include gases comprising gas ions or polar molecules, each of which can be selectively attracted to the programmed surface potentials provided on a charge array wafer. Polar molecules may include $NH_3$ and $H_2S$ as examples. These polar molecules have an electric dipole moment, with positive and negative poles. $H_2O$ vapor or liquid may be used, wherein the polar property of the $H_2O$ molecule may be used for selective patterning, wherein the selection depends on the polar orientation. For patterning such tiny deposition elements, the side dimension of the charge storage cells may be advantageously reduced to a few tens of nanometers. Thus a range of charge array wafers having a corresponding range of side dimensions of the charge storage cells may be developed to optimally pattern a diverse selection of deposition materials, to achieve a desired three-dimensional circuit structure for example. Such a circuit structure may include deposited geometries having a minimum feature size measured in tens of nanometers for example, when gas ions or polar molecules are deposited. Thus an embodiment of a manufacturing system of the present invention may be configured for atomic layer deposition, ALD, or molecular layer deposition, MLD. As another example, a deposited structure may include strategically placed iron to improve inductor performance, or ultra-thin layers produced using reactive gas molecules or ions. This level of integration, in the proposed size range of the deposition particles, across a wide range of deposition materials, including newly definable depositions enabled by the presence of previously unavailable finishing stations, is not currently available by any other known manufacturing process. Furthermore, embodiments of the present invention comprise manufacturing processes that are electronically programmable, and configurable as roll-to-roll processes for manufacturing efficiency.

To make a full wafer the final product instead of dicing it into integrated circuit chips, will be a departure from normal practice in the semiconductor industry. The economics may be attractive if an existing facility making 200 mm wafers is adapted for making the charge array wafers. Electronic reading of the content of the charge storage cells will not be required. This is because for the intended operation of the charge array wafer, the effect of the stored charge will be used directly, using the electric field emanating from each cell that is charged. The yield on the charge storage wafers may be high because the minimum feature size will typically be considerably larger than the minimum feature size currently used with flash memory designs, around seven nanometers. Also, if for example the cells have an edge dimension of one micron and the pixel size is set at five microns, a single defective cell may represent a tolerable defect, not a reason to reject the wafer. If the charge array wafers lead to attractive manufacturing systems, and confidence in the technology is established, it may make economic sense to move to 300 mm wafers, whereupon the maximum image size corresponding to the size of the array of charge storage cells 16 will increase from a diameter of around 190 mm to around 290 mm. Although these are limited circuit sizes, they can still be complex electronic systems. Rather than being a system on a chip, SOC, they can be a much more complex system on a flexible dielectric substrate. Consider that the current line and space capability for integrated circuit chips is around 0.032 microns (10 nanometer node in 2015), for printed wiring boards (PWBs) around 100 microns, and for the proposed circuits around 1-5 microns. This places interconnect density for the proposed products approximately midway between state-of-the-art semiconductor chips and current PWBs. To be further discussed, semiconductor chips may also be integrated into the proposed products to create hybrid electronic systems, HESs, and thin film transistors may also be integrated in the proposed electronic systems.

Figure 2:
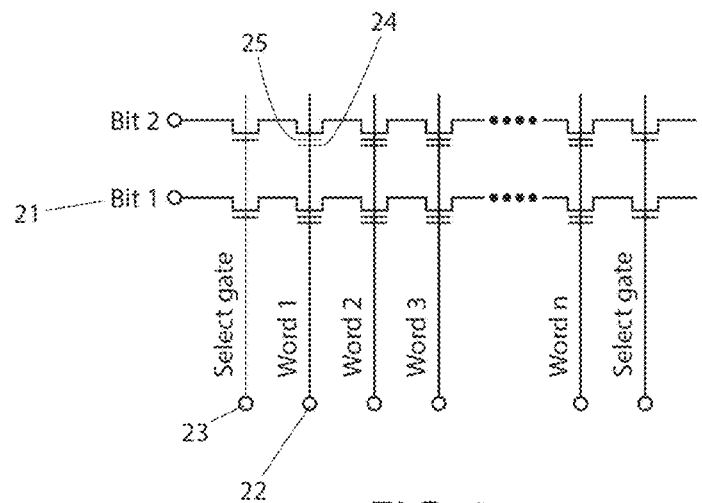
FIG. 2 is a schematic circuit diagram showing a NAND configuration of charge storage cells according to an embodiment of the present invention.

FIG. 2 depicts a circuit schematic for a NAND configured charge storage array. Bit lines 21 and word lines 22 are shown. At each end of a NAND string a select gate 23 is provided, to activate the bit lines for the addressed cells. In between the select gates is a string of charge storage cells in series, each cell comprising a control gate 24 and a floating gate 25. In a flash memory, the number of cells in series may be 16 or 32 for example, to make reading of the cells achievable with an acceptable response time. However, in the proposed charge wafer arrays, the content of the cells does not need to be read, as required for a semiconductor memory cell. The cells do their work by projecting up from the wafer surface electric fields that vary according to the programmed charge image, and the response time to a read signal is not relevant in the intended application. Accordingly, the number of cells in series may be extended to create a NAND string across substantially the width of a wafer. This may be done to avoid "holes" or unpatterned regions in the charge image, that would otherwise be required to implement select gates and/or bit-line contacts. Long write times may be tolerable in the intended application; for example, a write time of several milliseconds would typically be unacceptable for a conventional memory application, but not necessarily a problem in the intended application. For testing charge array wafers 10 wherein electronic reads are not available, the wafers may be programmed with a checkerboard pattern and dusted with a charged toner. Defects will appear either as holes in a desired square of deposition material, or dots of material in a desired blank square. Then the checkerboard pattern can be reversed and the test repeated. In this manner each charge storage element may be tested with regard to its operational ability to attract or reject deposition material of each polarity, a more relevant test than electronic reading of the cell contents in terms of ones and zeroes.

Figure 3:
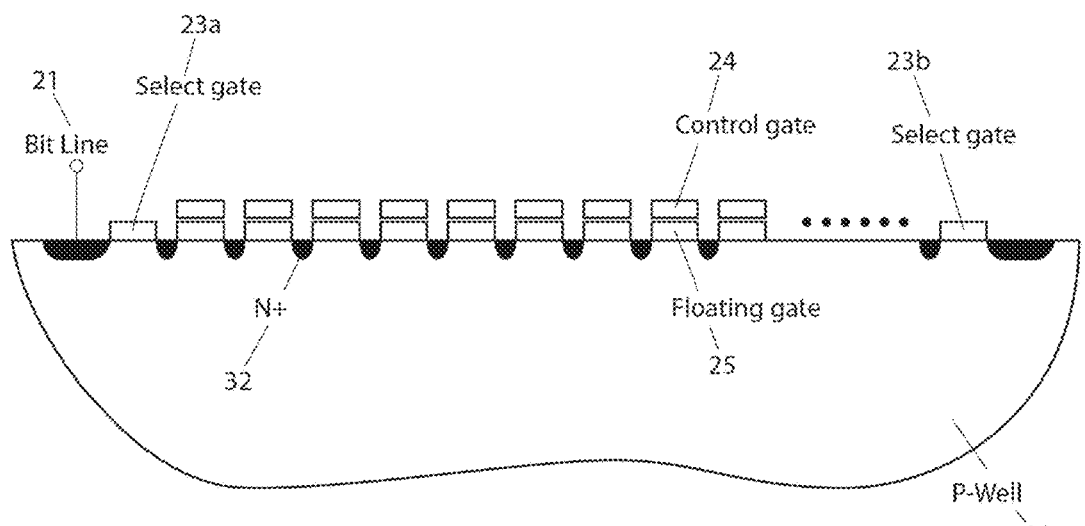
FIG. 3 is a cross-sectional view showing a layout of the circuit of FIG. 2.

FIG. 3 illustrates in cross-section a layout of a single bit line circuit, as defined in FIG. 2. Bit line 21, select gates 23a and 23b, control gate 24 and floating gate 25 are shown. Bit line 21 includes a bit line contact and this is a general requirement: adjacent each select gate one bit line contact is required. In addition, N+ source and drain regions 32, and P-Well 33 are shown. As previously described, the select gates and bit line contacts may be moved into peripheral circuit region 15 of charge array wafer 10, in order to avoid interruptions in a charge image to be created on the charge array wafer. Either a bit line contact or a control gate inside array 2 of electrical charge storage cells 3 depicted in FIG. 1A will create an unacceptable interruption in the charge image that can be formed, if either the contact or the control gate coincides with a feature to be patterned. In contrast with conventional structures in which select gates are repeated at a periodicity of 16 or 32 cells, in the present embodiment a single pair of select gates can be utilized per bit line. In conventional systems, a select gate for a bit line might control access to 16 word lines, providing control over two 8-bit bytes. However, in embodiments of the present invention, a single pair of select gates can control a large number of cells, for example, 100 cells, 500 cells, 1,000 cells, 5,000 cells, 10,000 cells, 25,000 cells, 50,000 cells, 100,000 cells, more than 100,000 cells, or the like.

Figure 4:
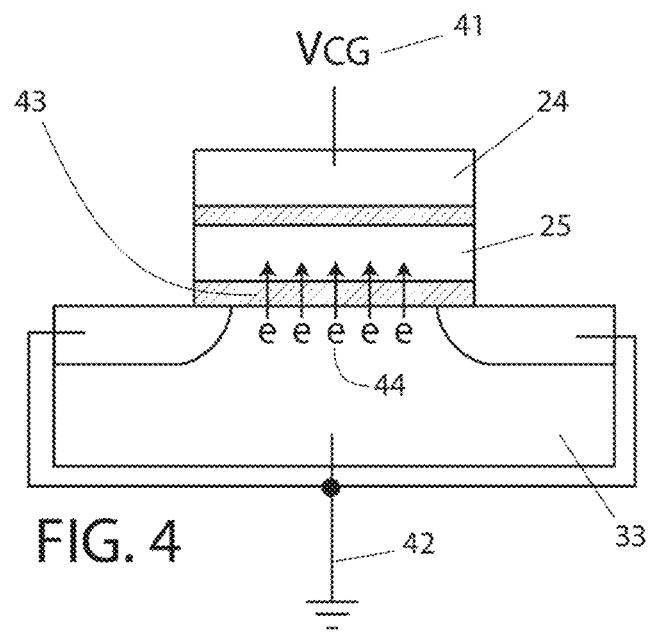
FIG. 4 is a schematic cross-sectional view of a charge storage cell configured for trapping electrons in a floating gate.

FIG. 4 depicts Fowler-Nordheim tunneling, used to trap electrons in floating gate 25. Control gate 24 is shown connected to $V_{CG}$ 41, the applied control gate voltage. P-Well 33 is grounded as shown 42. A thin oxide layer 43 is shown, thin enough to allow tunneling of electrons 44 through thin oxide layer 43 to floating gate 25, under the applied electric field asserted by $V_{CG}$ and the grounded P-Well. Thus a positive charge on floating gate 25 can be neutralized, or for a different value of $V_{CG}$ 41, a negative charge can be programmed onto floating gate 25.

Figure 5:
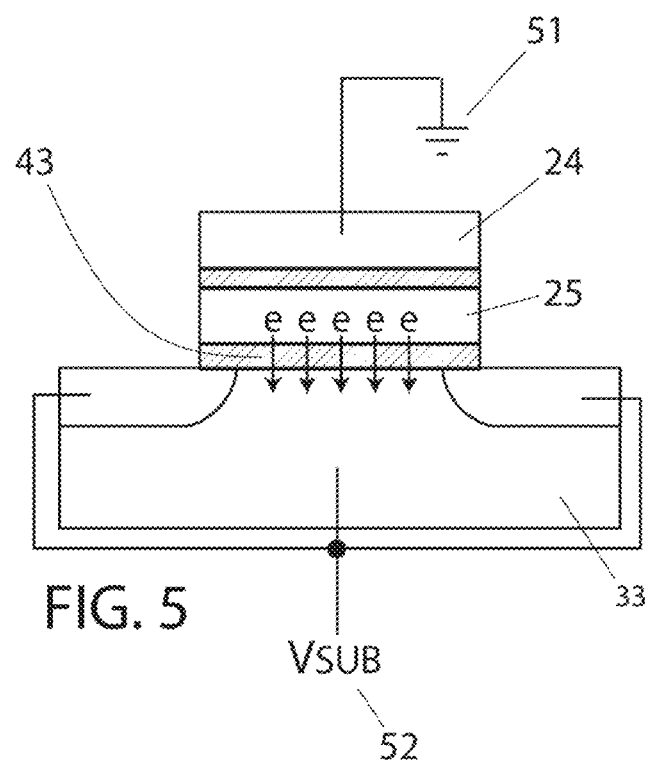
FIG. 5 is a schematic cross-sectional view of a charge storage cell configured for removing electrons from a floating gate.

FIG. 5 depicts Fowler-Nordheim tunneling, used to remove electrons from floating gate 25. Again, control gate 24, floating gate 25, P-Well 33 and thin oxide layer 43 are shown. For this configuration, control gate 24 is connected to ground 51 as shown, and a positive voltage $V_{SUB}$ 52 is applied to P-Well 33, to erase excess charge on floating gate 25, or for a different value of $V_{SUB}$, to program floating gate 25 with a positive charge consisting of holes.

Figure 6:
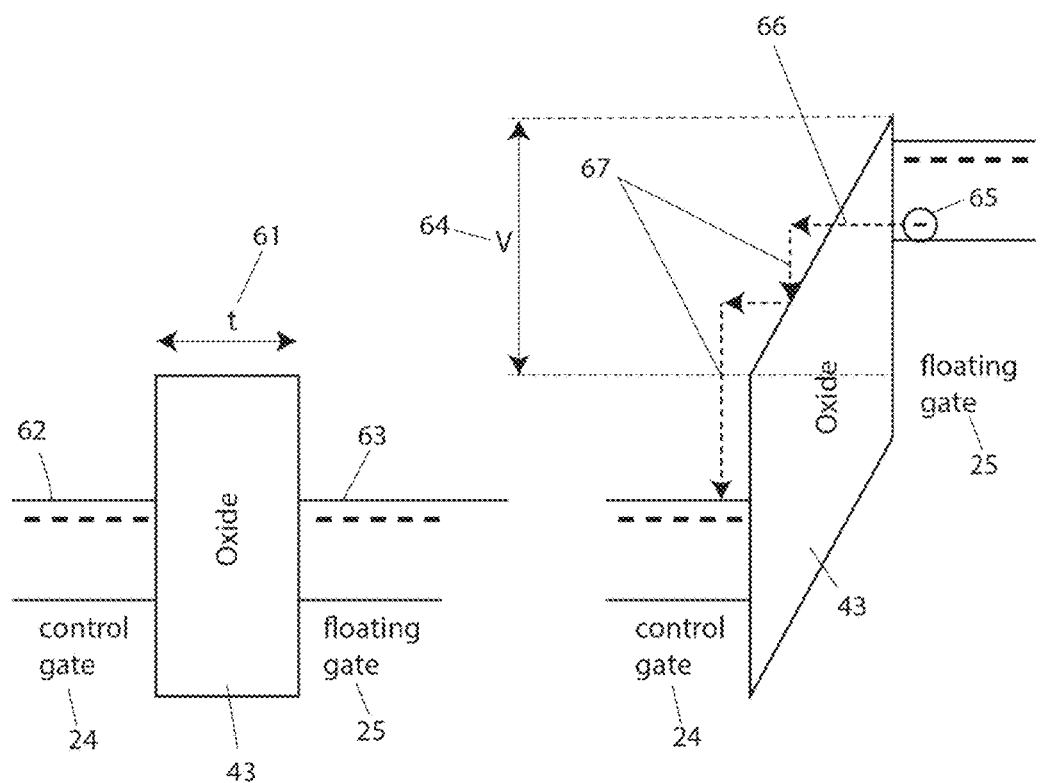
FIG. 6 is an energy band diagram that illustrates electron tunneling through an insulator to alter the charge on a floating gate.

FIG. 6 further depicts Fowler-Nordheim tunneling, in terms of an energy band diagram. On the left hand side of the figure, thin oxide layer 43 is shown, having a thickness t 61 which may be approximately 7 nm in current flash memories. The energy levels of conduction band electrons 62 in the control gate 24 and conduction band electrons 63 in the floating gate 25 are shown equal. When a voltage V 64 is applied between floating gate 25 and control gate 24, a triangular shaped voltage distribution appears across oxide 43 as shown. Now an electron 65 "sees" a narrower barrier and can tunnel through it 66, and then drop in a series of collisions with the lattice 67 to the conduction band of the control gate as shown. If the polarity of V 64 is reversed, the electrons will be able to tunnel in the reverse direction. Voltage V 64 can be set to a value that predetermines the desired level of charge on the floating gate, either positive or negative. Alternatively, since only a potential difference is required for imaging, the charge states can be set to negative and neutral in another preferred embodiment of a patterning system of the present invention.

Figure 7A:
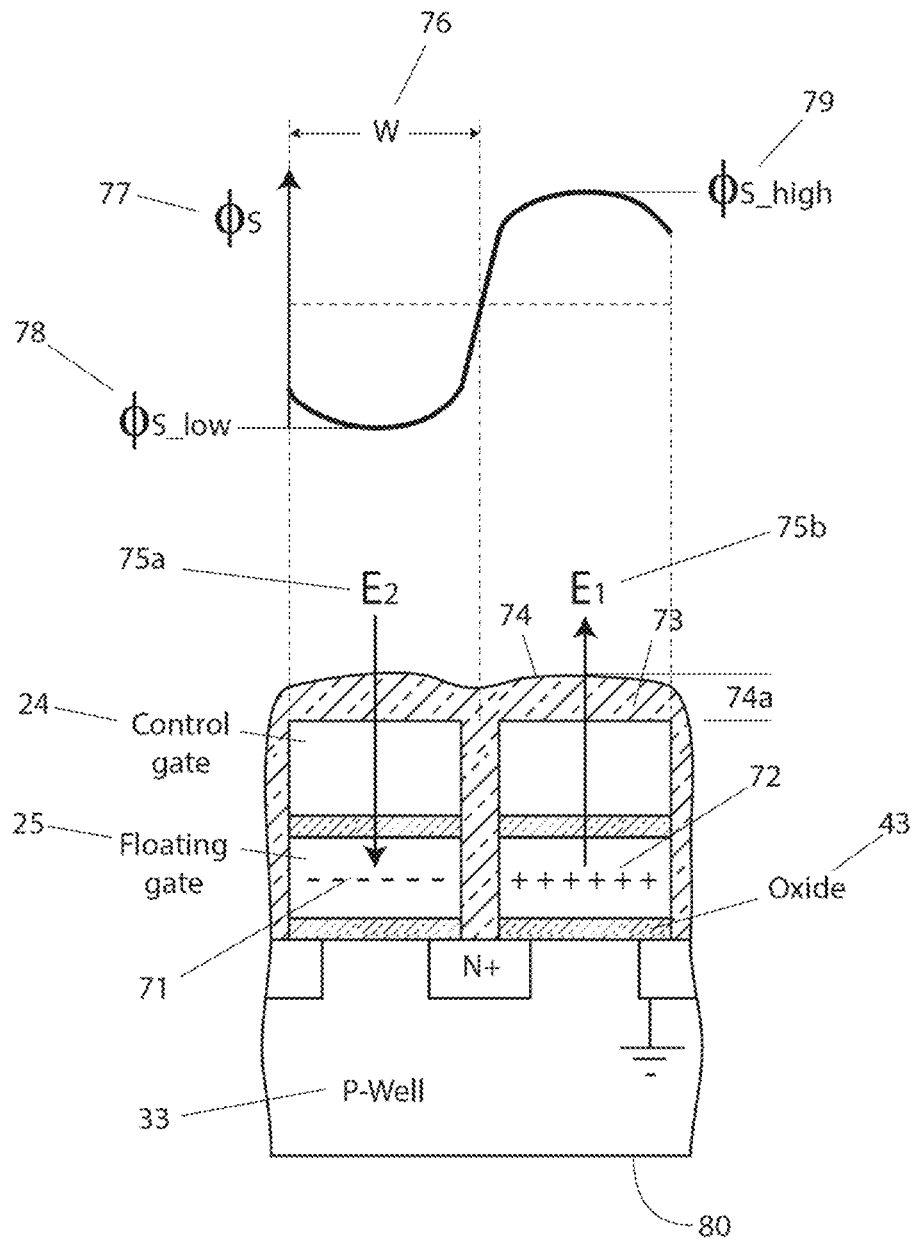
FIG. 7A is a schematic side view of adjacent charge storage cells showing charges on the floating gates, electric fields resulting from the charges shown penetrating a passivation layer and emerging from a top surface, and surface potentials corresponding to the electric fields.

FIG. 7A schematically depicts the electric charges, electric fields, and surface potentials of adjacent charge storage cells 3 of FIG. 1A in a preferred embodiment of the present invention. Control gate 24, floating gate 25, thin oxide layer 43 and P-Well 33 are shown. Charges on the floating gates include negative charge 71 and positive charge 72 at the adjacent cell. Different numbering schemes may be used to detail particular embodiments, including this embodiment. Accordingly, a passivation layer 73 is also shown, having an exposed surface 74. Passivation layer 73 preferably covers the top surface of support wafer 1 except for through wafer vias 11 and/or contact pads near the periphery. Passivation layer 73 may comprise silicon dioxide, silicon nitride, or silicon oxy-nitride as examples. Passivation layer 73 preferably has a thickness 74a less than the edge dimension W 76 of a charge storage cell, in order that strong electric fields 75a and 75b penetrate passivation layer 73 and extend into the space above surface 74, to interact with and pattern charged deposition material that is presented to charge array wafer 10, such presentations to be further described. An effect of electric fields 75a and 75b is to create a surface energy profile plotted as $\phi S$, 77, including a low surface energy $\phi S\_low$, 78, corresponding to a negatively charged cell, and a high surface energy $\phi S\_high$, 79, corresponding to a positively charged cell. It is known from the science of electrophotography that a surface potential difference of 70-90 volts between adjacent pixels of a latent charge image formed on a photoconductive drum is sufficient to provide high resolution imaging of toner particles developed for laser printing. In a typical example, these toner particles have a diameter of 10 μm, a charge-to-mass ratio of 12 μC/gm, and an electrical charge of 8 fC, around 50,000 electrons. This provides a comparative measuring point for determining a compatible set of parameters for the present invention, including edge dimension c, 4 of an electrical charge storage cell 3, oxide layer thickness t 61 of FIG. 6, and voltages $V_{CG}$ 41 and $V_{SUB}$ 52 of FIGS. 4 and 5 for programming the cells. The backside 80 in this embodiment of the charge array wafer is also shown.

Figure 7B:
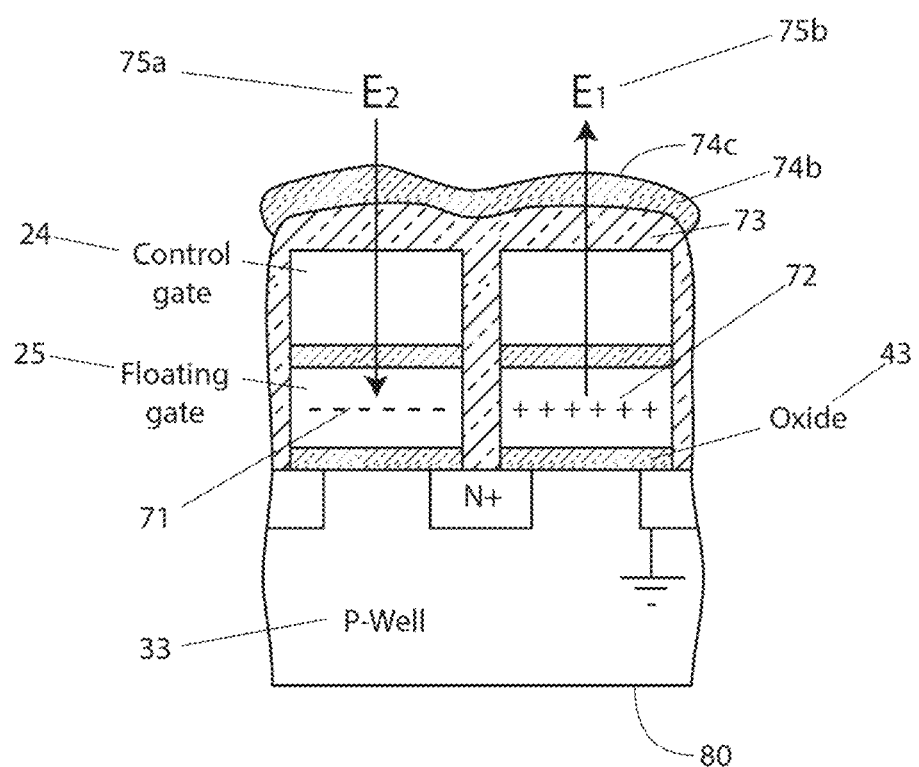
FIG. 7B is a schematic side view of adjacent charge storage cells showing one or more protective or special purpose layers coupled to the passivation layer, and electric fields emerging from a top surface.

FIG. 7B is a schematic side view of adjacent charge storage cells showing one or more protective or special-purpose layers 74b having a top surface 74c coupled to the passivation layer. Since the top surface of a charge array wafer is a working surface in the intended application, potentially being brushed with deposition particles from a deposition material source for example, an added layer that can withstand abrasion may be desirable, and the top surface 74c having a low friction surface may be particularly desirable for allowing alignment features such as ring alignment features 13 and radial alignment features 14 of FIG. 1 to be effective. As will be further discussed, a coating that comprises a material having a low surface energy, such as PTFE, may also be desirable. Accordingly, the one or more protective or special-purpose layers 74*b* may be silicon nitride or PTFE for example, although any other material may be used.

Figure 8:
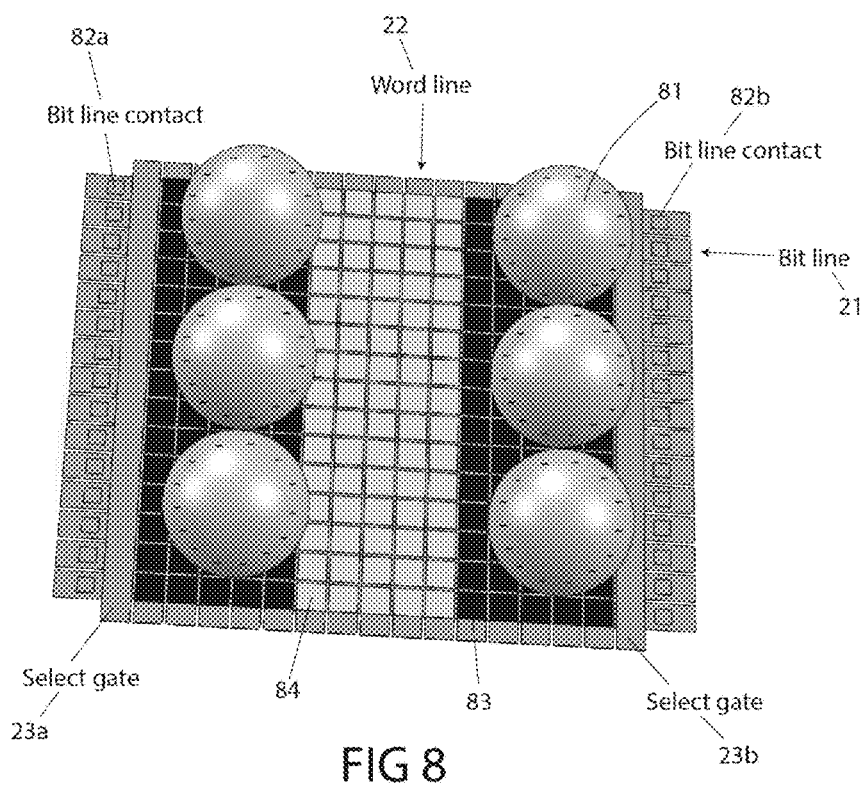
FIG. 8 is a perspective view of negatively charged deposition material selectively attracted to charge storage cells having a high surface potential.

FIG. 8 depicts a 3-D model of a small rectangular portion of a charge storage array, depicted as array 2 in FIG. 1A. Negatively charged spheres 81 of deposition material are shown, selectively attracted to specific regions at the surface of a charge array wafer 10. Bit line 21 and Word line 22 are shown. Select gates 23*a* and 23*b* are illustrated. Bit line contacts 82*a* and 82*b* are also shown. The charge storage cells shown in black 83 have a surface potential of $\phi S\_high$ 79 from FIG. 7A, and the white charge storage cells 84 have a surface potential of $\phi S\_low$ 78, and these varying surface potentials provide the driving forces that pattern the deposition material. Alternatively, a driving force may be computed as the total force of Coulomb attraction or repulsion, the sum of the product of charge and local electric field for each elemental charge on a deposition particle.

Experience with electrophotography has determined that dielectric toner particles typically require the addition of charge control agents, CCAs, and flow control agents, FCAs, in order to create consistently repeatable imaging processes. An example of a material that can provide both of these characteristics is fused silica in a size range of 20-150 nm. It can be dry blended with a deposition material for example, and may comprise a weight percentage of 0.1-2.5%.

Figure 9:
FIG. 9 is a cross-sectional view of deposition material depicted in FIG. 8, after transfer to a substrate and fusing by a heat source.

FIG. 9 shows in cross-section a typical end result of the patterning described in reference to FIG. 8, after transfer to a target substrate 91, and fusion by a heat source (not shown). Deposits such as 92 may comprise a dielectric material such as fluorinated ethylene propylene, FEP, having a melting point of 260° C., well within the capabilities of a flexible substrate material such as polyimide that may be employed for target substrate 91. A typical maximum processing temperature for a polyimide substrate is 400° C. Depending on the requirements of the deposition and finishing processes, less expensive substrates such as polyethylene terephthalate, PET, may be used. Heat stabilized PET has a typical maximum processing temperature of around 150° C.

Figure 10:
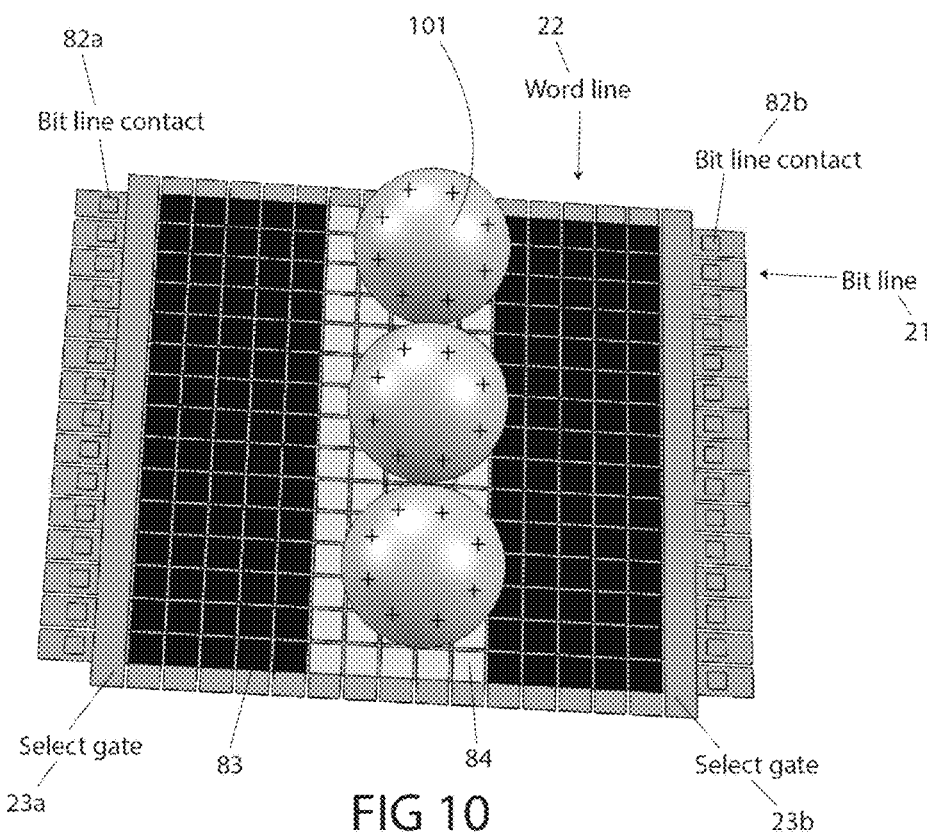
FIG. 10 is a perspective view of positively charged deposition material selectively attracted to charge storage cells have a low surface potential.

FIG. 10 depicts a similar 3-D model to that shown in FIG. 8, illustrating positively charged spheres of deposition material 101 selectively attracted to specific regions at the surface of a charge array wafer 10. Positively charged spheres 101 may comprise solder for example. Bit line 21 and Word line 22 are shown. Select gates 23*a* and 23*b* are illustrated. Bit line contacts 82*a* and 82*b* are also shown. The charge storage cells shown in black 83 have a surface potential of $\phi S\_high$ 79, and the white charge storage cells 84 have a surface potential of $\phi S\_low$ 78. It can be seen that the positively charged particles are attracted to areas of the surface having a low surface potential, and are repelled from areas of the surface having a high surface potential. Thus the patterning behavior of an array of charge storage elements is demonstrated.

Figure 11:
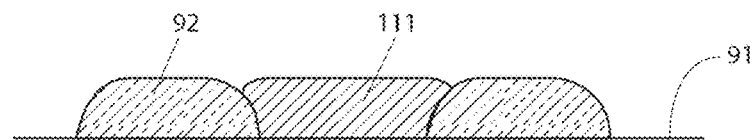
FIG. 11 is a cross-sectional view of deposition material depicted in FIG. 10, after alignment and transfer to the substrate depicted in FIG. 9, and fusing by a heat source.

FIG. 11 shows in cross-section a typical end result of the patterning described in reference to FIG. 10, after alignment and transfer to a target substrate 91, and fusion by a heat source (not shown). Deposits such as 111 may initially comprise spheres of solder such as Sn99.3Cu0.7, having a melting point of 227° C., again well within the capabilities of a flexible substrate material such as polyimide. One can see in the figure that, with proper alignment, the first deposition of dielectric material such as 92 serves to constrain the second deposition of conductive material such as 111, and also that the resulting surface is approximately planar. This will lead to a preferred product strategy, wherein fine line interconnects are created as the first layers in a multi-layer product definition, to be further described.

Figure 12:
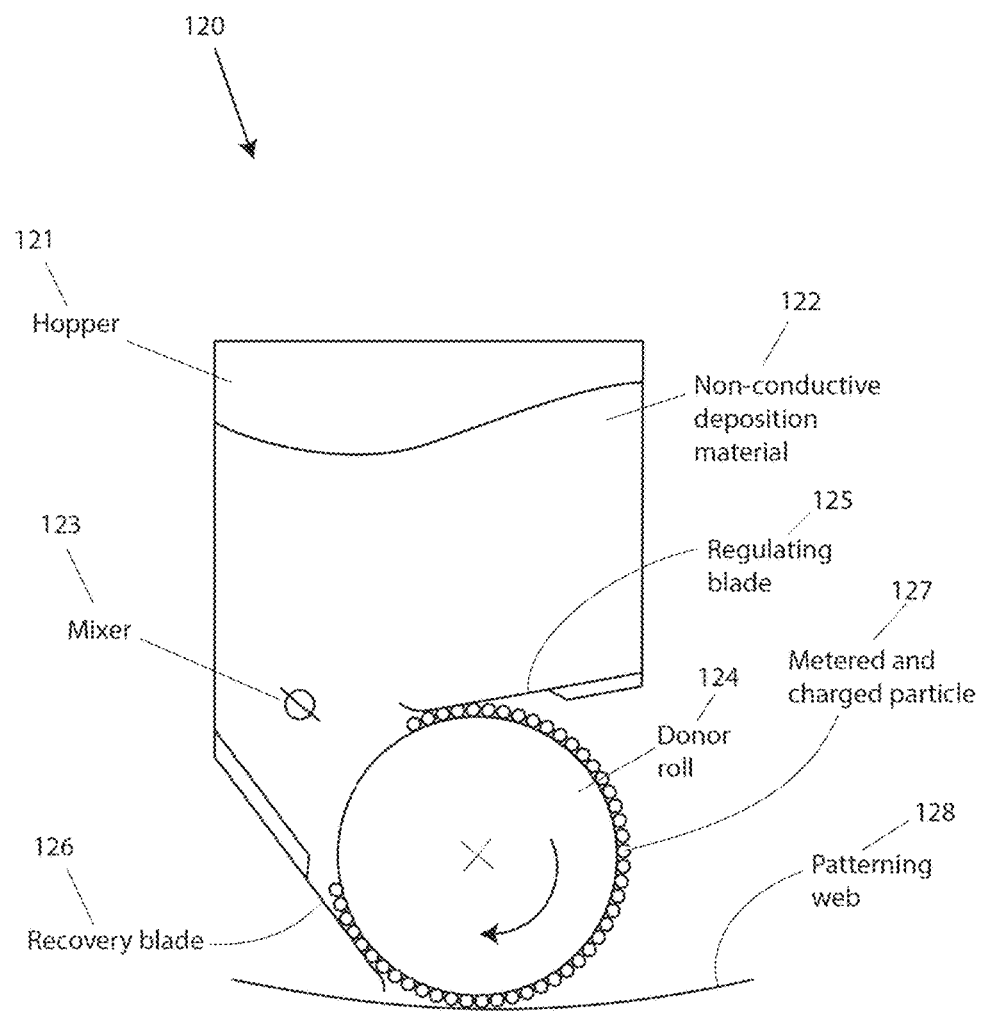
FIG. 12 is a schematic side view of a deposition material source comprising a donor roll, configured to provide to a patterning web charged particles that are non-conducting, such as dielectric particles, according to an embodiment of the present invention.

FIG. 12 depicts a device 120 for metering and charging non-conductive or dielectric deposition material. Device 120 may be well suited for presenting deposition material from a donor roll 124 to a patterning web 128 for example. A hopper 121 contains deposition material 122 and a mixer 123 is provided. Particles on donor roll 124 interface with a regulating blade 125 and a recovery blade 126. In operation, when non-conductive particles move under regulating blade 125 they are charged by friction. They are also preferably metered into a monolayer of particles as shown in the figure. Regulating blade 125 may comprise a stainless steel sheet having a thickness of 0.002-0.008 inches for example. Donor roll 124 is preferably textured by sand blasting for example, to help hold or retain the particles in contact with it. Recovery blade 126 may comprise a polypropylene plastic sheet having a thickness of 0.010-0.040 inches for example. It can be seen that the metered and charged deposition particles 127 can be presented to a patterning web 128 as shown. As previously discussed, the non-conductive particles will preferably have been blended with tiny additional particles acting as charge control and flow control agents.

Figure 13:
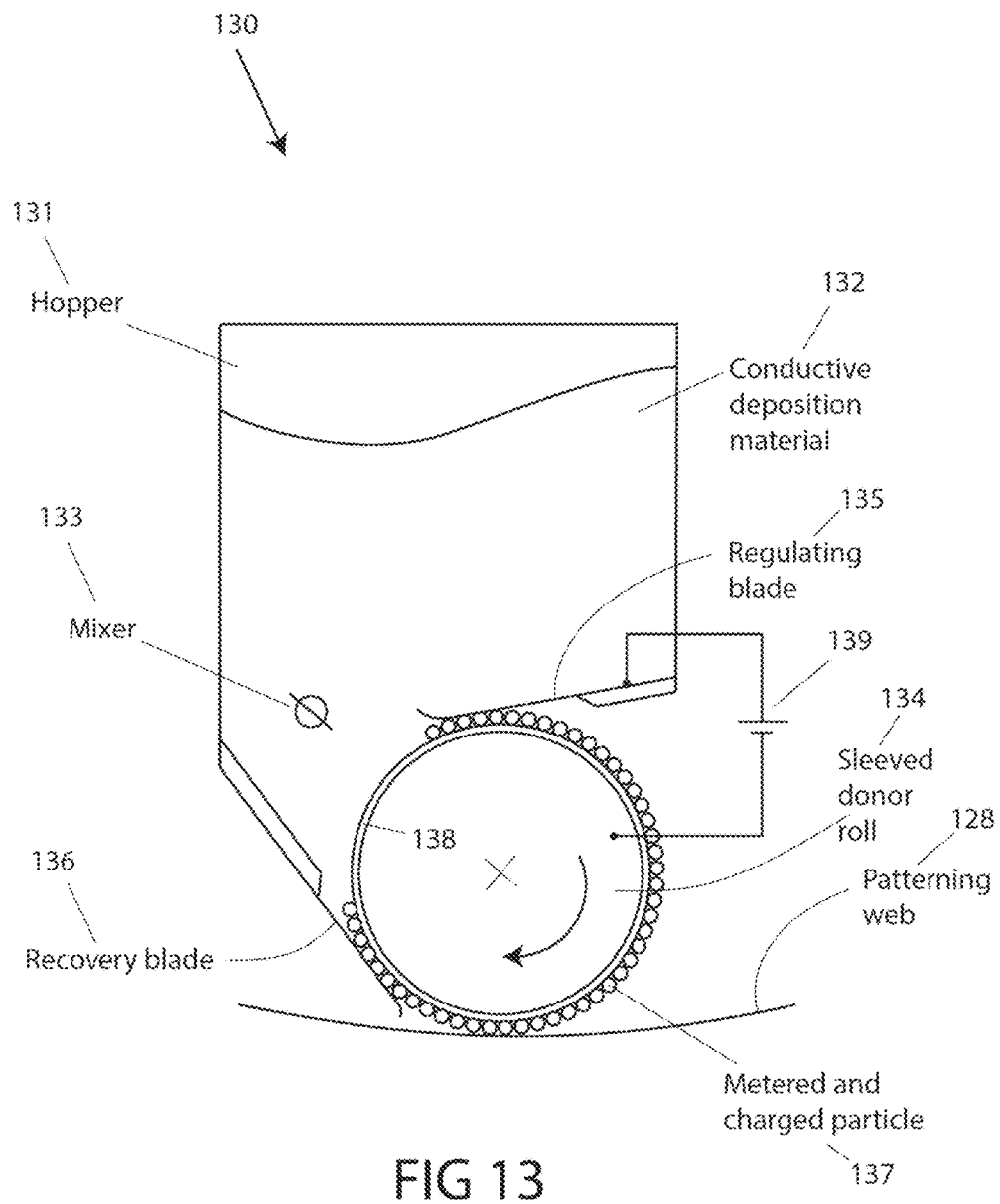
FIG. 13 is a schematic side view of a deposition material source comprising a donor roll, configured to provide to a patterning web charged particles that are conducting, such as solder particles, according to an embodiment of the present invention.

FIG. 13 illustrates a device 130 for metering and charging conductive deposition material. Device 130 may be well suited for presenting deposition material from a sleeved donor roll 134 to a patterning web 128 for example. Device 130 has many similarities to device 120 described above, including a similar form factor and a similar presentation of the metered and charged deposition material 137 to a patterning web 128. A hopper 131 contains deposition material 132 and a mixer 133 is provided. Particles on sleeved donor roll 134 interface with a regulating blade 135 and a recovery blade 136. In operation, when conductive particles move under regulating blade 125 they are charged by induction, wherein a conductive particle will become charged in an external electric field, in such a manner that the resulting electric field inside the particle is zero. The external electric field is asserted by a voltage source 139 connected between regulating blade 125 and the internal conductive portion of sleeved donor roll 134, which is equipped with a non-conductive sleeve 138 as shown. The charged particles are also preferably metered into a monolayer of particles as shown in the figure. Regulating blade 135 may comprise a stainless steel member having a thickness of 0.002-0.008 inches for example. Recovery blade 126 may comprise a polypropylene plastic sheet having a thickness of 0.010-0.040 inches for example. It can be seen that the metered and charged deposition particles 137 can be presented to a patterning web 128 as shown. As previously discussed, the conductive particles will preferably have been blended with tiny additional particles acting as charge control and flow control agents.

Figure 14:
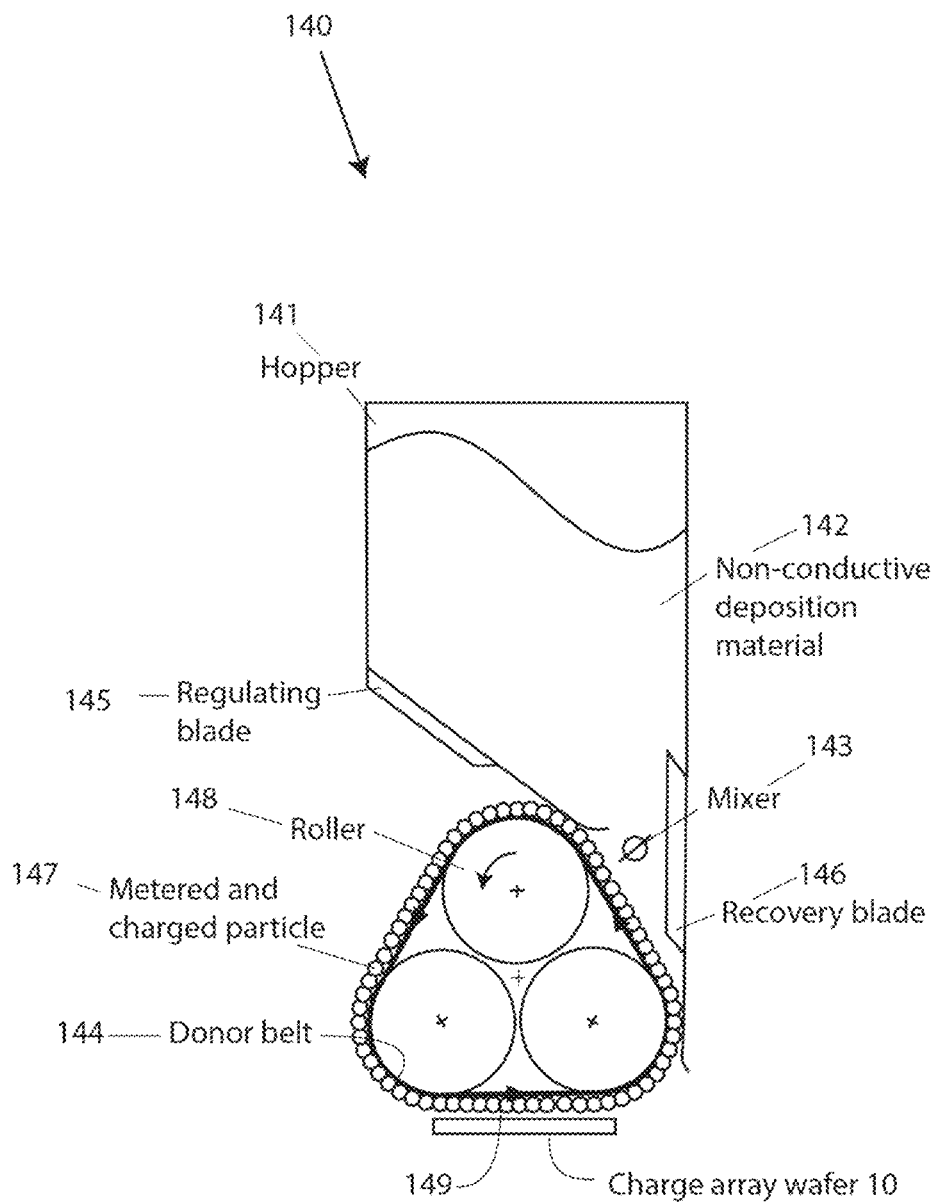
FIG. 14 is a schematic side view of a deposition material source comprising a donor belt, configured to provide to a charge array wafer charged particles that are non-conducting, such as dielectric particles, according to an embodiment of the present invention.

FIG. 14 depicts a device 140 for metering and charging non-conductive or dielectric deposition material and may be well suited for presenting deposition material from a donor belt 144 to a charge array wafer 10 for example, wherein a flat region of the belt 149 opposes planar charge array wafer 10. A hopper 141 contains non-conductive deposition material 142 and a mixer 143 is provided. Particles on donor belt 144 interface with a regulating blade 145 and a recovery blade 146. In operation, when non-conductive particles move under regulating blade 145 they are charged by friction. They are also preferably metered into a monolayer of particles 147 as shown in the figure. Regulating blade 145 may comprise a stainless steel member having a thickness of 0.002-0.008 inches for example. Donor belt 144 is preferably textured by sand blasting for example, to help hold or retain the particles in contact with it. Recovery blade 146 may comprise a polypropylene plastic sheet having a thickness of 0.010-0.040 inches for example. It can be seen that the metered and charged deposition particles 147 can be presented to a charge array wafer 10 as shown. As previously discussed, the non-conductive particles will preferably have been blended with tiny additional particles acting as charge control and flow control agents.

Figure 15:
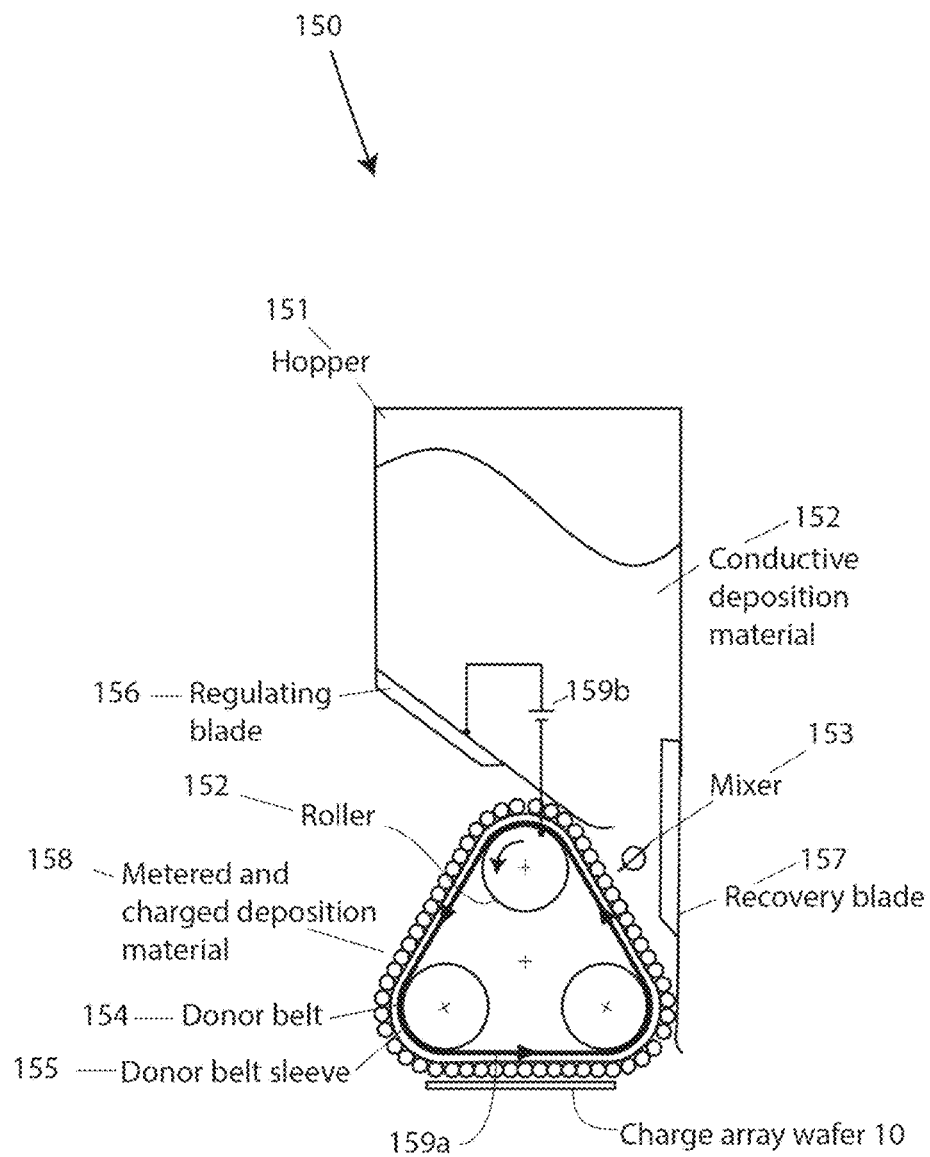
FIG. 15 is a schematic side view of a deposition material source comprising a sleeved donor belt, configured to provide to a charge array wafer charged particles that are conducting, such as solder particles, according to an embodiment of the present invention.

FIG. 15 illustrates a device 150 for metering and charging conductive deposition material and may be well suited for presenting deposition material from a sleeved donor belt 154 to a charge array wafer 10 for example, wherein a flat region of the belt 159a opposes planar charge array wafer 10. Device 150 has many similarities to device 140 described above, including a similar form factor and a similar presentation of the metered and charged deposition material 158 to a charge array wafer 10. A hopper 151 contains conductive deposition material 152 and a mixer 153 is provided. A sleeved donor belt 154 includes a non-conductive sleeve 155 and interfaces with a regulating blade 156 and a recovery blade 157. In operation, when conductive particles move under regulating blade 156 they are charged by induction, wherein a conductive particle will become charged in an external electric field, in such a manner that the resulting electric field inside the particle is zero. The external electric field is asserted by a voltage source 159b connected between regulating blade 156 and the internal conductive portion of sleeved donor roll 154. The charged particles are also preferably metered into a monolayer of particles 158 as shown in the figure. Regulating blade 156 may comprise a stainless steel sheet having a thickness of 0.002-0.008 inches for example. Recovery blade 126 may comprise a polypropylene plastic sheet having a thickness of 0.010-0.040 inches for example. It can be seen that the metered and charged deposition material 158 can be presented to a charge array wafer 10 as shown. As previously discussed, the conductive particles will preferably have been blended with tiny additional particles acting as charge control and flow control agents.

Figure 16A:
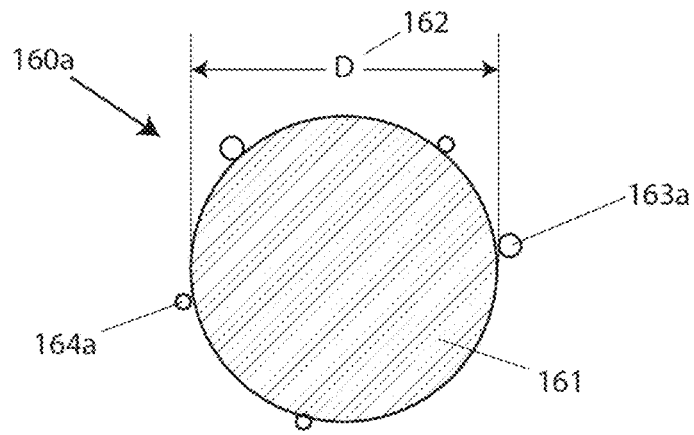
FIG. 16A is a cross-sectional view of a spherical non-conducting particle that may be used in a deposition material source, according to an embodiment of the present invention.

FIG. 16A depicts a spherical non-conductive particle 160a such as may be used by a manufacturing system of the present invention. Particle 160a may comprise a dielectric material 161 and has a diameter D 162 that may vary between a few nanometers and around 10 μm. Toners for printing with laser printers on paper have been developed with diameters as small as 5 μm. However, the present invention may accommodate tiny nano-particulates like carbon nanotubes for example, providing they are suitably charged. For spherical particles having a diameter around 5 μm, it is typically desirable to provide charge control agents, CCAs, such as 163a and flow control agents, FCAs, such as 164a. The charge control agents may comprise a weight percentage of 0.1-2.5% for example. This low percentage of additives to deposition materials may have a minimal effect on the properties of as-cured or as-fused films for example, and the flow-related and charge stability related effects of the additives may be considerable. Fused silica in a size range of 20-150 nm has been used as both a CCA and an FCA.

Figure 16B:
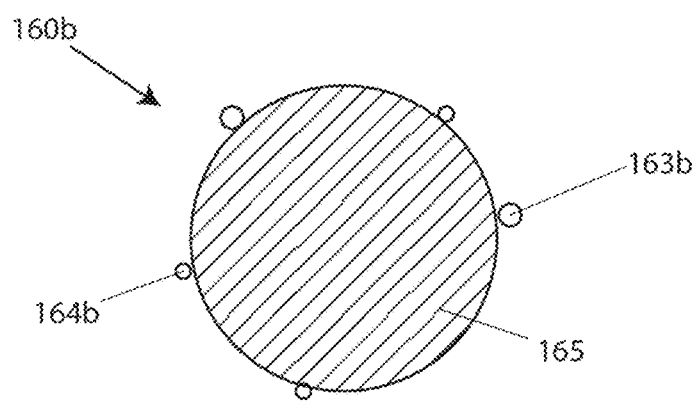
FIG. 16B is a cross-sectional view of a spherical conducting particle that may be used in a deposition material source, according to an embodiment of the present invention.

FIG. 16B illustrates a conductive particle 160b such as may be used by a manufacturing system of the present invention. Particle 160b may comprise solder 165 for example and may also have a diameter that may vary between a few nanometers and around 10 μm. Solder 165 may comprise Sn99.3Cu0.7 for example, having a melting point of 227° C. CCAs 163b and FCAs 164b are preferably provided, and have the functionality previously described.

Figure 16C:
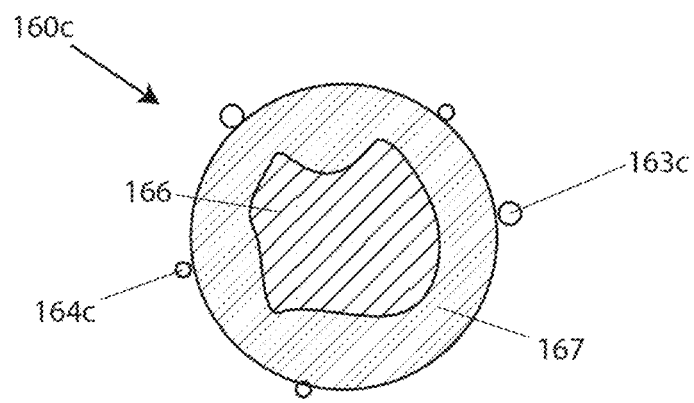
FIG. 16C is a cross-sectional view of a spherical particle comprising an encapsulated deposition material that may be used in a deposition material source, according to an embodiment of the present invention.

FIG. 16C is a cross-sectional view of an encapsulated deposition particle 160c, such as may be used by a manufacturing system of the present invention. Particle 160c may have a diameter ranging from 3-15 μm for example, with a typical value of 5 μm. Fabrication of particle 160c can build on experience developed with encapsulated toners used in printers and copiers, particularly by CANON CORPORATION. The interior of particle 160c is occupied by a nugget 166 of desired material for deposition on the target substrate. The nugget may have an arbitrary shape as shown. Surrounding nugget 166 is a shell 167, which, in some embodiments, can include a material that can be vaporized or otherwise removed by a finishing module, leaving behind just the desired material present in nugget 167.

In some embodiments, shell material 167 may be selected to provide good triboelectric properties, enabling particle 160c to be easily and consistently charged, such as using device 120, previously described in reference to FIG. 12, or using device 140, previously described in reference to FIG. 14. Polymerized toners for printers and copiers are otherwise known as chemical toners. They have been produced with a spherical shape and a tighter size distribution than was achievable with the prior generation of attrited toners, manufactured by a pulverizing process. CCAs 163c and FCAs 164c are preferably provided, and have the functionality previously described.

In addition to a standardized particle diameter, the charging behavior and the physical behavior of a wide range of deposition materials can potentially be standardized around a common shell material 167. Standardized physical behavior may extend to flow properties and also hardness. The latter property relates to the potential use of the particles for lowering friction between the target substrate and the charge array wafers, further relating to precise local alignment using the active registration process described herein.

Figure 17:
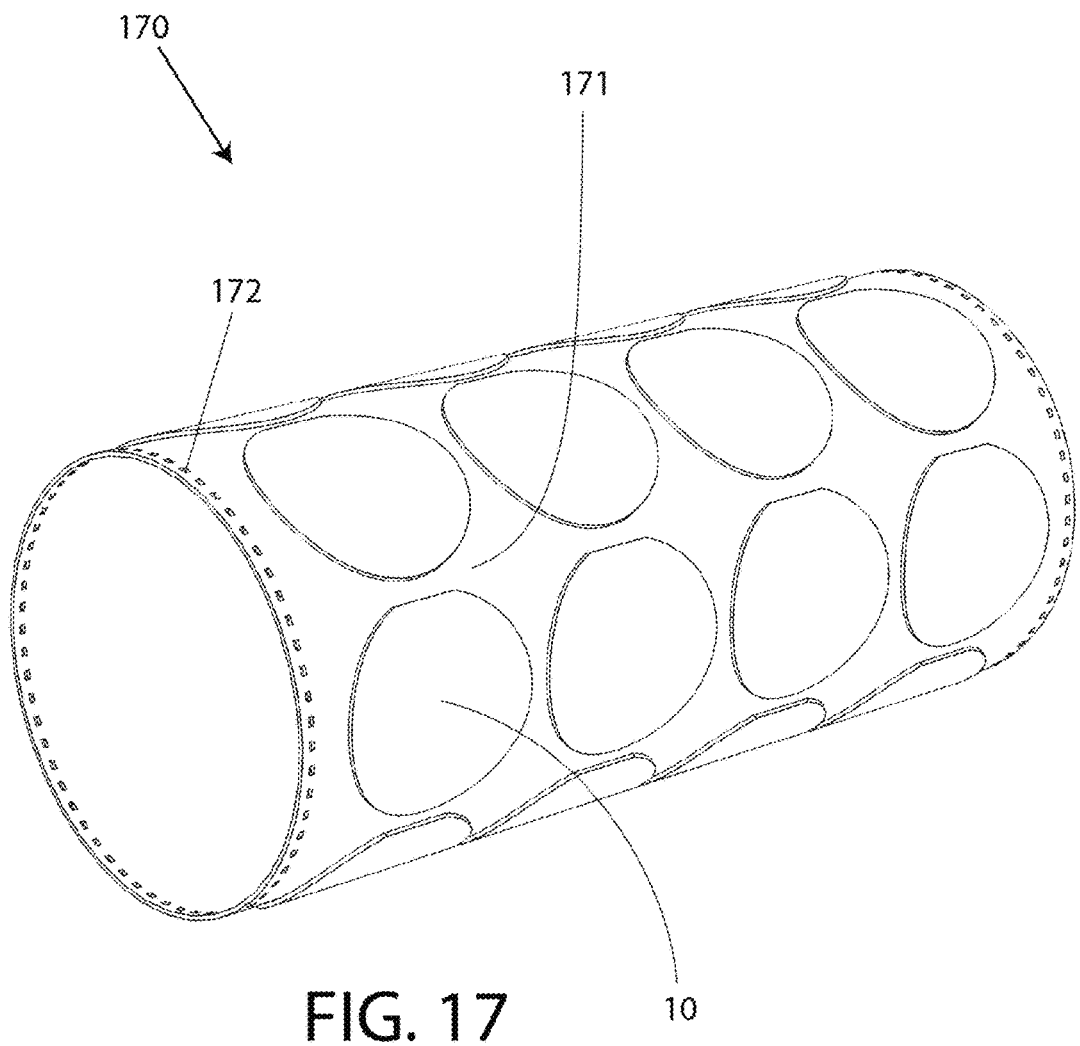
FIG. 17 is a perspective view of an exemplary patterning web of the present invention.

FIG. 17 shows an exemplary patterning web 170, comprising a flexible substrate 171, sprocket holes 172, and an array of charge array wafers 10 mounted on the substrate. The wafers are preferably thinned to a thickness of around 25 μm, using grinding and etching methods known in the art. Thus the wafers will be flexible and the patterning web will also be flexible. The upper side of each wafer faces outward so that the electric field emanating from the charge storage cells will be available at the outer surface of the patterning web. Flexible substrate 171 may comprise polyimide material, which is dimensionally stable, tough for use in a manufacturing environment, and has the ability to withstand processing temperatures up to around 400° Centigrade. This is critical to providing a wide range of finishing options, to be further described. A continuous web of polyimide material may be manufactured with no seam or joint using a casting procedure for example. Charge array wafers 10 should be precisely located on substrate 171. This may be achieved using the surface tension of molten solder, potentially used in conjunction with through wafer vias such as through wafer vias 11 described in reference to FIG. 1A, the process to be further described. Sprocket holes 172 illustrate one method for providing by mechanical means gross positioning of patterning web 170 in a deposition module to be further described. The ring alignment features 8 and the charged radial alignment features 9 described in reference to FIG. 1A may be used to provide precise positioning relative to an opposing substrate such as an opposing portion of a target substrate 91, wherein the precision alignment is localized to each of the charge array wafers 10. This precise positioning, available through the proposed active registration technique applied to a pair of films that are either momentarily paused in a stationary relationship, or moving in contact, will contribute to a good overlay accuracy between different layers of the circuit to be produced. In exemplary patterning web 170, a plurality of charge array wafers 10 is provided. Typically, each of the plurality of charge array wafers, numbering 24 in FIG. 17, will be identically programmed to match a single deposition material in the associated deposition module. The target substrate will receive 6 rows of 4 identical patterns for the patterning web depicted. Thus, manufacturing systems employing patterning webs such as 170 are suited for high volume production.

Figure 18:
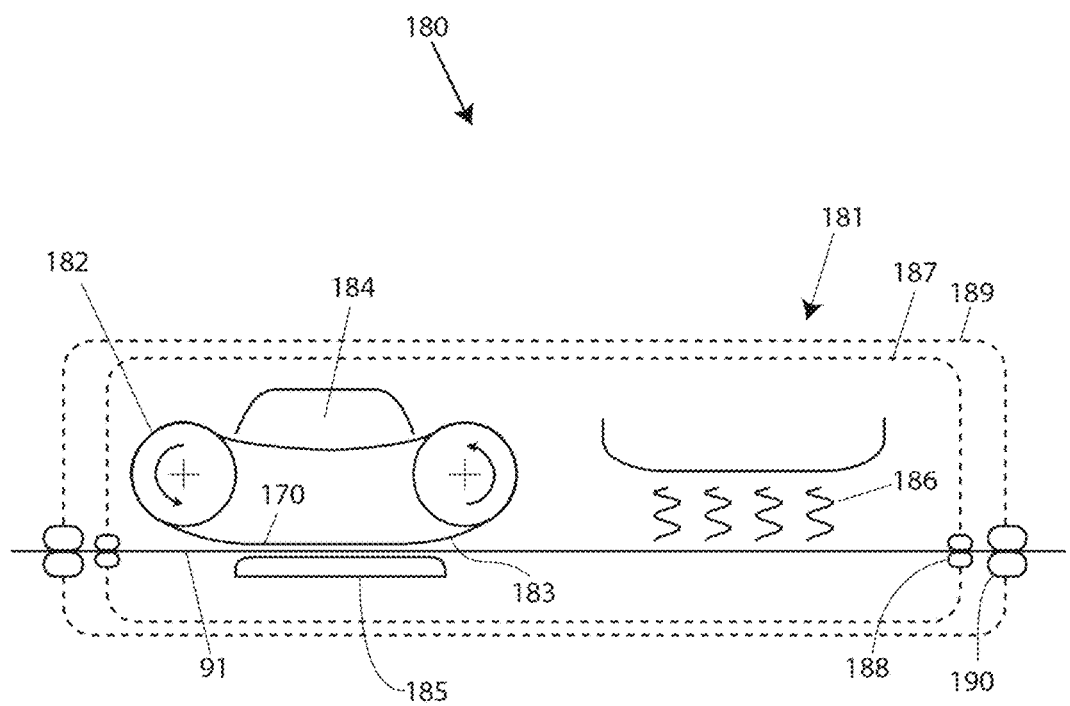
FIG. 18 is a schematic side view of an exemplary in-line deposition module of the present invention, including an optional finishing station and various containment options for supporting different process environments.

FIG. 18 is a schematic side view of an exemplary in-line deposition module 180 according to an embodiment of the present invention. Module 180 includes an optional finishing module 181 and various containment options for supporting different process environments, as described below.

A target substrate 91 is the substrate on which layers of deposition material will be created, and the material of this substrate preferably matches the material of the associated patterning web 170, in order to facilitate precision alignments between them. Target substrate 91 has been preferably pre-processed to provide alignment patterns in the form of embedded charges. The embedded charges may be provided by ion implantation, including the use of ion implanters that can project beams of electrons or protons across several centimeters in air. Patterning web 170 is shown loosely draped over rollers 182; the loose draping 183 enables coarse alignment between patterning web 170 and target substrate 91 using mechanical elements such as sprockets and sprocket holes, while allowing fine alignment between them using the active registration method to be further described. A source of deposition material 184 is shown. Source 184 may present deposition material to patterning web 170 in multiple forms, including but not limited to a gas, a liquid, or a powder, and the patterning web and the enclosure of the source material may be configured accordingly. Examples of deposition material sources have been described in reference to FIGS. 12 through 15. The materials presented by source 184 may be of many types, including but not limited to conductive, dielectric, resistive, magnetic, optical and semiconductor materials. Transfer unit 185, which can also be referred to as a transfer electrode, is shown, used for electrostatic transfer of imaged deposition material on the charge array wafers arrayed on the patterning web to target substrate 91, while retaining the desired image formation. Transfer unit 185 may comprise an electrode as shown in the figure, connected to a high potential, not shown. This transfer process is preferably similar to the transfer process used in electrophotography. To be further described in reference to FIG. 20C, the voltages applied to electrode 185 may include different values during an alignment phase and a subsequent transfer phase. Transfer electrode 185 may also extend so as to be positioned underneath target substrate 91 as it moves past finishing module 181. Transfer electrode may also be divided into two electrodes, with different voltages applied to each of the different electrodes, optimized for alignment and transfer respectively. Exemplary finishing module 181 may be used for further processing of the material deposited. Finishing module 181 may apply heat 186 as shown, but many other finishing steps are possible. These include physical processes such as rolling for compressing or flattening the deposition material on substrate 91. A grounded metal roller may also be used to discharge the previously deposited material. Other finishing processes may comprise chemical reactions such as plating or etching, or an irradiating source such as a laser or other source of electromagnetic waves, or the deposition of a conformal layer that may not be patterned, but may be reactive with certain elements of the underlying deposition material. Finishing module 181 may be also used to charge or discharge the previously deposited material. An optional inner chamber 187 is shown enclosing deposition module 180, with seals 188 shown at the interface with the moving target substrate 91. Chamber 187 may be used to provide a background atmosphere to module 180; the atmosphere may include a gas like argon or nitrogen or hydrogen for example, or a gas mixture; these may be used to prevent unwanted reactions of the deposited material with air or moisture. An optional outer chamber 189 is also shown, with seals 190 at the interface with moving target substrate 91. Outer chamber 189 may be used to provide a vacuum environment, and again this may be useful to prevent unwanted reactions of the deposition material with air or moisture, either before or after it is delivered to substrate 91. Both inner chamber 187 and outer chamber 189 may be used simultaneously, to provide flexibility in selecting an optimal background atmosphere for the particular material being deposited and finished, and perhaps to optimize the evacuation of oxygen or water vapor from the region where deposition and finishing are performed.

Figures 19A, 19B, 19C:
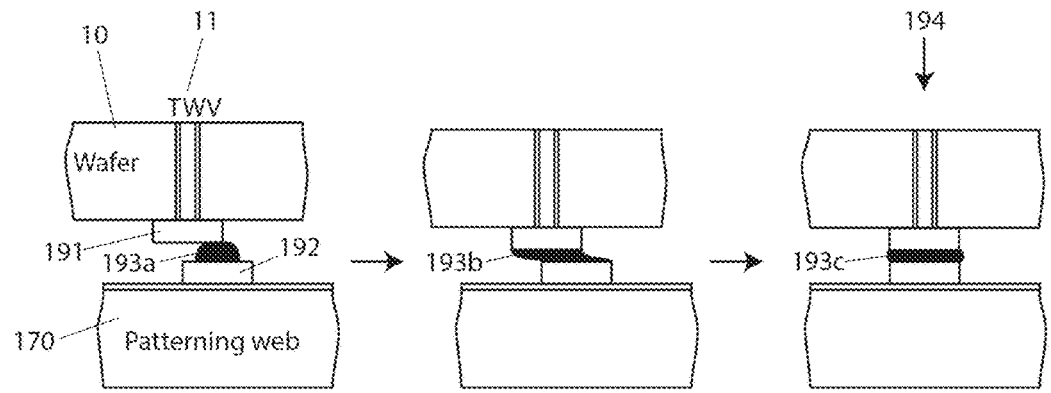
FIG. 19A is a cross-sectional view of a wafer opposing and approximately aligned to a patterning web with a solder connection in between, according to an embodiment of the present invention.
FIG. 19B is a cross-sectional view of a wafer opposing a patterning web with a solder connection in between, after the solder has melted, according to an embodiment of the present invention.
FIG. 19C is a cross-sectional view of a wafer opposing a patterning web with a solder connection in between, after surface tension has pulled the parts into alignment, according to an embodiment of the present invention.

FIGS. 19A-19C are side views of an alignment sequence used to align a charge array wafer with a patterning web according to an embodiment of the present invention. As described below, the alignment sequence utilizes the surface tension of molten solder during the alignment process.

Referring to FIGS. 19A-19C, a sequence for bonding two parts is illustrated, wherein the surface tension of molten solder is employed to assist in providing a precision alignment between the parts. In FIG. 19A, a portion of charge array wafer 10 is shown, with a through wafer via 11. Through wafer via 11 terminates in a pad 191 that is aligned with the via as shown.

Opposite to wafer 10 is a portion of patterning web 170 with a pad 192 that is in approximate alignment with pad 191. This approximate alignment may have been provided by a mechanical positioning system, not shown. Between pads 191 and 192 solder 193a is provided. Solder 193a may be screened onto pad 192 in some embodiments. In FIG. 19B, the solder has been melted, 193b, and, as a result of surface tension, is beginning to assert a force to align pads 191 and 192. In FIG. 19C, the surface tension of solder 193b and 193c has pulled the parts into precise alignment, 194. Utilizing this process, embodiments of the present invention can typically achieve an alignment tolerance in the range of ±1 μm. Other methods may be used for alignment of these components, and other alignment accuracies may be achieved.

Figure 20A:
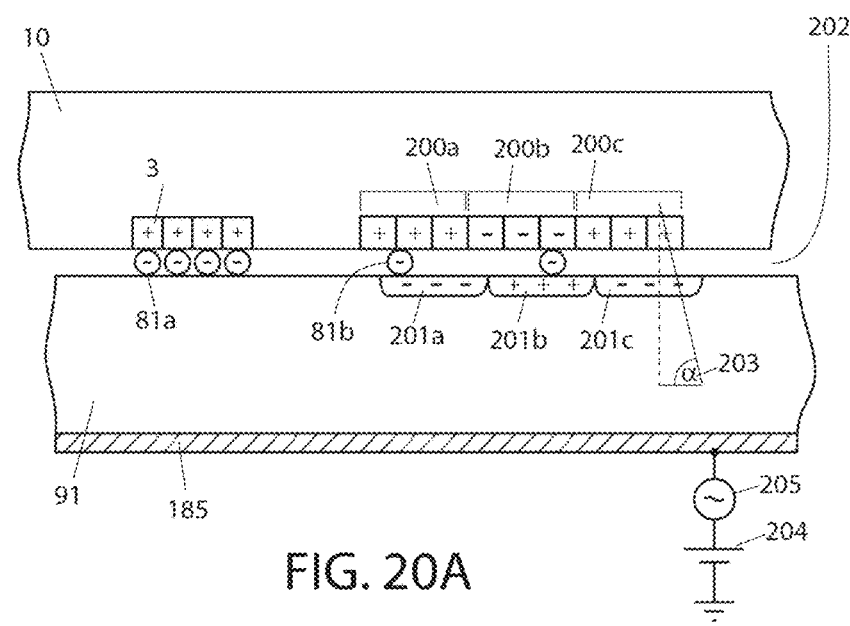
FIG. 20A is an enlarged cross-sectional schematic view of alignment features comprising rings of embedded charge in opposing substrates, according to an embodiment of the present invention.

FIG. 20A is an enlarged schematic cross sectional view depicting matched ring alignment features 8 in a charge array wafer 10 and in an opposing portion of a target substrate 91 according to an embodiment of the present invention. Different labels are used for the charged features in this particular embodiment. Referring to FIG. 20A, the interface between charged alignment rings is illustrated. It can be seen that the ring alignment features 8 of wafer 10, 200a, b, c, approximately line up with matching alignment rings of target substrate 91, 201a, b, c, wherein opposing features have opposite polarity of electrical charge. This provides an example of charged features used to implement "active registration".

In this embodiment, electrical charge storage cell 3 is shown, together with adjacent ring alignment features 200a, 200b, and 200c at the active surface of a portion of a charge array wafer 10. The cells comprising ring alignment features 13a, b, c may each be merged into a single cell rather than three separate cells, in which case their definition would be different from cells like 3. Opposite wafer 10 is shown a portion of target substrate 91, in which charged ring alignment features 201a, 201b, and 201c have been provided. For maximum agility of the associated manufacturing process, charged features 201a, b, c, have preferably been provided in a pre-processing step, using for example ion implantation in a blank target substrate prior to mounting it in a deposition module. Additional charged features such as radial alignment features 9 of FIG. 1A, and index marks are preferably also provided, but are not shown in FIG. 20A. In general, Coulomb forces are exerted via repulsion between like charges and attraction between unlike charges. The illustrated charge features provide a restoring force to create precision alignment between a charge array wafer 10 and the associated portion of a target substrate 91. The ring alignment features serve to center charge wafer 10 correctly above matching features in target substrate 91. Preferably, angular alignment will also be asserted using the radial alignment features 9 described in reference to FIG. 1A. The precision alignment is local to a charge array wafer and may be operating while the wafer 10 and the target substrate are in motion through a roll-to-roll manufacturing system for example; it is an important feature of the present invention. This alignment process is described herein as "active registration". At the interface 202 between charge array wafer 10 and substrate 91 it is desirable to provide low friction in order for the coulomb alignment forces to have maximum effect. One technique to achieve such a low friction interface is to provide deposition material in the form of spherical particles, as described in reference to FIGS. 8, 10, and 16A-16C. Spherical particles such as 81a and 81b will act like ball bearings to reduce friction at interface 202. Alternatively, a liquid deposition species may employ oil as a carrier, wherein the oil provides lubrication to enhance a low friction interface. In FIG. 20A we see spherical deposition particles such as 81a from FIG. 8; these particles have been patterned and are in the process of being transferred to target substrate 91. We also see randomly placed particles such as 81b which are attracted to embedded charge elements on one side of interface 202 and repelled from corresponding embedded charge elements on the other side of interface 202. The figure shows a small misalignment between charge array wafer 10 and target substrate 91; this small misalignment may be the result of initial positioning using mechanical alignment features of a deposition module, such as sprocket holes 172 of FIG. 17 for example. The misalignment can be characterized by an angle α 203, which is the angle to the horizontal of a force vector representing attraction between positively and negatively charged features as shown. An AC voltage source 205 that may be combined with a DC voltage source 204 may be applied to transfer electrode 185 of FIG. 18, to modulate the coupling between charge array wafer 10 and target substrate 91, to be further described in reference to FIGS. 20B and 20C.

The mathematical model of a parallel plate capacitor may be used to estimate the electrostatic force between opposing charged features, as in the present invention. This force shall be described herein as the "residual coupling force", 205a.

Residual coupling force $F = k\epsilon_0 A V^2 / 2d^2$ where

F=normal force in Newtons=4.2 N when using the given parameter values.
k=dielectric constant=1.0
$\epsilon_0$=permittivity of free space=8.85×10$^{-12}$ F/m
A=total area of rings=π×mean dia×width=π×0.195m×6×10$^{-3}$ m=3.7×10$^{-3}$ m$^2$
V=80 volts
d=5×10$^{-6}$ m The calculated force magnitude of 4.2 N is slightly less than 1 lb. This value of the residual coupling force is judged to be sufficient to provide precision local alignment if low friction is provided, as in the present invention.

Figure 20B:
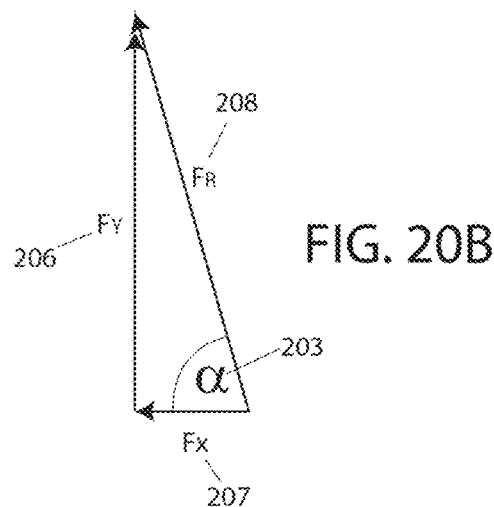
FIG. 20B is a force vector diagram relating to the vertical and horizontal components of the force acting on the alignment rings of FIG. 20A.

FIG. 20B shows the vector components $F_x$ 207 and $F_y$ 206 of resultant force $F_R$ 208 acting at angle α 203. Since the force of friction between two parts is proportional to the normal force pushing them together, friction between the opposing substrates due to the residual coupling force will be proportional to $F_y$ 206. It can be seen in reference to FIG. 20C that the vertical force may be modulated by applying an AC voltage to electrode 185. Horizontal force component $F_x$ 207 provides a restoring force to enable alignment between wafer 10 and substrate 91, since alignment or re-alignment occurs in the horizontal plane. Accordingly, by properly combining an adequate force $F_x$ 207 with low friction materials, and by further reducing friction by controlling the vertical force, precision alignment can be achieved.

Figure 20C:
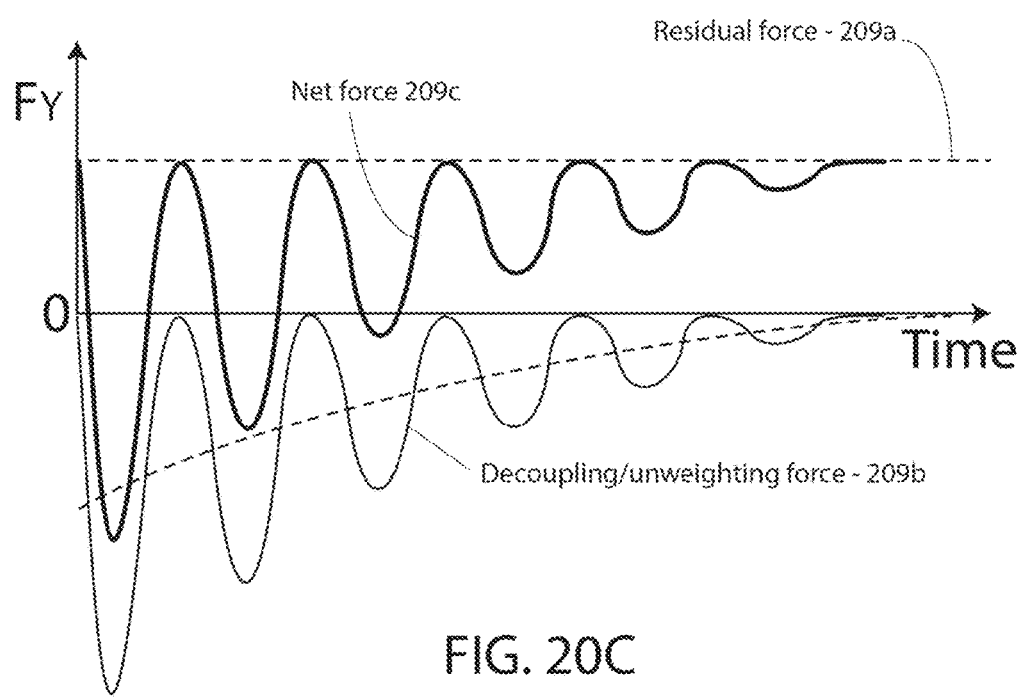
FIG. 20C is a graph showing vertical force versus time, wherein the net vertical force is modulated to assist with local alignment of opposing substrates.

FIG. 20C illustrates a method for unweighting or uncoupling a charge wafer 10 positioned for alignment above a target substrate 91. The uncoupling effectively reduces the friction between them to zero during brief periods, allowing the restoring alignment forces to act. Vertical force $F_Y$ is plotted versus time, with a zero value shown.

If a set of three alignment rings such as 13a, b, c, or 201a, b, c, described in reference to FIG. 20A contains two rings of one charge polarity and one ring of the other charge polarity, this imbalance in the total charge will cause a modulating force on the set of rings when an AC voltage 205 is applied at transfer electrode 185. The modulating force at any instant will equal the product of the net charge and the applied voltage. AC voltage 205 may be a decaying sinusoid for example, having an initial amplitude of several hundred volts for instance, so that during initial cycles of voltage 205 the modulating force will exceed the sum of steady state forces acting on the set of rings. This situation is depicted in FIG. 20C where vertical force $F_Y$ 207 is plotted versus time, with a zero value shown. Modulating force 209b is shown, generated by a decaying sinusoidal voltage applied at voltage source 205 of FIG. 20A. The sum of the vertical components of solid state forces, $F_{SS}$, 209a, is also shown. The solid state forces will include the residual force 205a described above, plus the force due to any DC voltage 204 acting on the same imbalance in the total charge of the set of alignment rings. DC voltage source may be zero volts in some embodiments of the present invention, or may be a DC transfer voltage in another embodiment for example. By adding modulating force 209b and the resultant steady state force 209a, the net vertical force 209c can be determined. Net vertical force 209c passes through zero during the initial cycles of modulating force 209b, as seen at 209d, allowing the opposing substrates to uncouple with zero or minimal friction between them, enabling precision alignment to occur. Modulating force 209b can also be adjusted to overcome any stiction that may be present at interface 202 of FIG. 20A. When sinusoidal modulating force 209b has decayed to zero, residual coupling force 205a described above will take effect to maintain the charge array wafer 10 in accurate local alignment with the target substrate 91, even when the substrate has moved away from electrode 185. This concludes the description of active registration in embodiments of the present invention.

Figure 21:
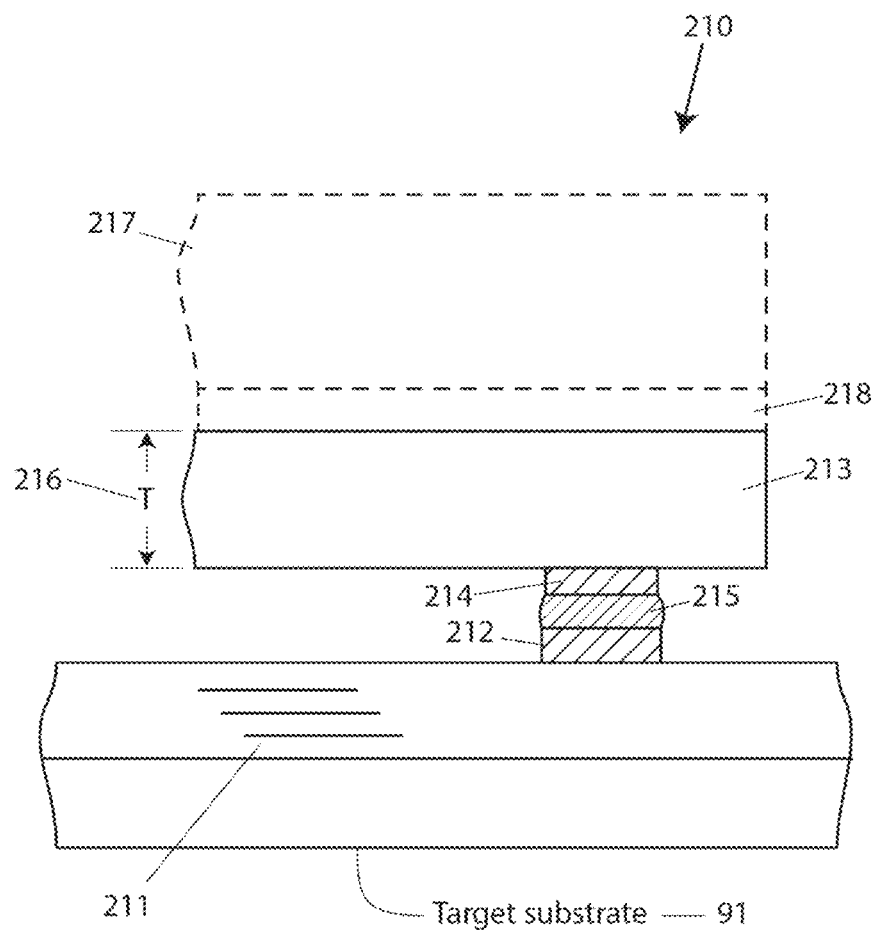
FIG. 21 is an expanded cross-sectional view of a flip chip connection between an input/output pad of an integrated circuit chip, and a corresponding input/output pad of a target substrate, according to an embodiment of the present invention.

FIG. 21 depicts a flip chip mounted assembly 210 wherein target substrate 91 has deposited layers 211 and a bonding pad 212 on its top side. An integrated circuit chip 213 is flip chip mounted to substrate 91 through bonding pad 214 and solder material 215. Without thinning of chip 212 it will have a typical thickness T 216 of around 600 μm. Accordingly, it will be rigid and able to be picked by a pick and place machine. If the wafer has been thinned before dicing into chips, a chip carrier 217 may be required, including an optional adhesive layer 218. This or a similar flip chip attachment process may be used in embodiments of a manufacturing system of the present invention, in order to create hybrid electronic systems, HESs.

Figure 22:
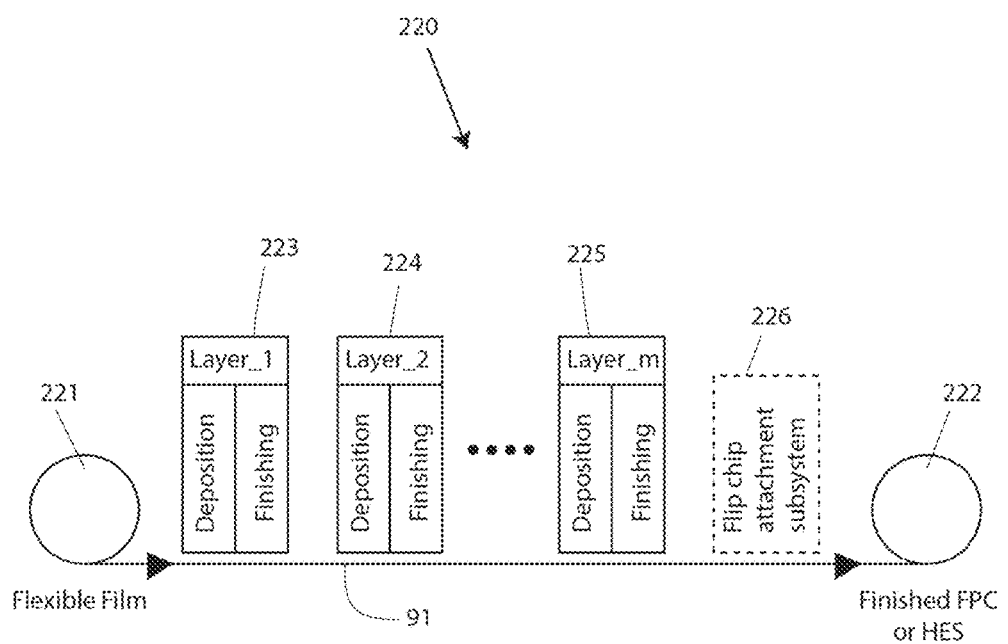
FIG. 22 is a schematic side view of an exemplary manufacturing system, according to an embodiment of the present invention.

FIG. 22 illustrates a R2R manufacturing system 220 employing deposition modules that comprise patterning webs, in the manner described in reference to FIG. 18. A source roll 221 comprising a flexible target substrate in rolled up form is shown. Preferably this substrate material has been pre-processed to embed alignment patterns and index marks. Index marks may be used to assist in the alignment of patterns on substrate 91, by indicating where a new pattern is about to begin for example. A first deposition module 223 is shown, including deposition and optional finishing capabilities, capable of creating the first patterned layer. A second deposition module succeeds the first module; it also includes deposition and optional finishing capabilities, and is capable of creating a second patterned layer that is aligned with and integrated with the first patterned layer. Additional modules up to the mth module 225 are provided, m being an arbitrary number that may range from 2-30 for example, each succeeding module capable of creating an additional layer that is aligned to and integrated with one or more of the preceding layers. A module that is either the last module or close to the last module may be a flip chip attachment subsystem 226, creating flip chip attachments as described in reference to FIG. 21, or in a similar manner. Thus a high resolution multi-layer flexible printed circuit, FPC, may be produced by manufacturing system 220, and if subsystem 226 is included, a hybrid electronic system, HES, may be produced. Embodiments of the present invention provide for line and space dimensions of around 5 μm for example, compared with around 100 μm for current generation printed wiring boards, PWBs. Another advantage comprises electronic programming of the patterns required for the deposited layers, leading to low incremental costs for either new product or pre-existing product, and fast turn-around times. Furthermore, increased automation is facilitated by a R2R system compared with a batch processing system.

If deposition modules can be reduced in size, it becomes more economic to provide a vacuum environment capable of enclosing an entire R2R manufacturing system, or large portions of it. Accordingly, FIGS. 23A, 23B, 24A, 24B and 24C address miniaturized modules that may be assembled into a compact R2R manufacturing system.

In FIG. 23A a miniaturized deposition module 230 is configured for depositing non-conductive deposition material. Module 230 incorporates a source for deposition material 140, described in reference to FIG. 14. Source 140 includes a donor belt, described in reference to FIG. 14, that is configured with flat regions that correspond in size with a charge array wafer 10 as shown. This allows alignment and transfer steps to occur while the donor belt is either rotating or paused in a stationary position. Instead of attracting the non-conductive deposition material 231 to a charge array wafer that is mounted on a patterning web such as 170, deposition material is attracted to an individual and separately functioning charge array wafer 10 as shown, in accordance with a pre-programmed charge image. Charge array wafer 10 is mounted in a wafer assembly 233 that is capable of rotating 180 degrees, as well as moving up and down vertically with respect to the target substrate 91. Finishing station 232 is also shown; however, it may be in a dormant mode. The transport of target substrate 91 may be accomplished using a stepper motor, or other transportation system that can start and stop with precision way points at index marks, in order that the attraction of charged particles to charge array wafer 10 can optionally occur while wafer 10 is stationary. Transfer electrode 185 is also shown, but may be inactive at this time, with no voltages applied.

FIG. 23B depicts a continuation of the process shown in FIG. 23A. Using a combination of vertical translations and a 180-degree rotation, wafer assembly 233 has been positioned with the attracted particles directly opposing target substrate 91. Active registration has been employed to provide precision alignment of charge array wafer 10 and its attracted material, the alignment occurring to alignment features embedded in target substrate 91. Urged by the presence of voltages applied to transfer electrode 185, such as voltage sources 204 and 205 described in reference to FIG. 20A, the attracted particles are transferred 235 to target substrate 91 as shown. Finishing station 232 has been activated, producing radiated heat 237 for example to fuse the transferred deposition material when it passes underneath. The fused material will preferably spread somewhat, to create more uniform lines for example, particularly when the deposition material is delivered as spherical particles, for example particles such as 160a, b, described in reference to FIG. 16C. To control this spreading and achieve more uniform lines of deposited material, electrode 185 may optionally extend underneath finishing station 232, or a separate electrode may be positioned underneath finishing station 232, the separate electrode having applied voltages optimized for achieving the desired amount of spreading. In an alternative embodiment, wafer assembly 233 together with charge array wafer 10 may be heated, to effect fusing of the deposited material to target substrate 91 while the imaging forces provided by wafer 10 and the transfer forces provided by electrode 185 are simultaneously in effect. In this embodiment, finishing station 232 may not be required.

Figure 23C:
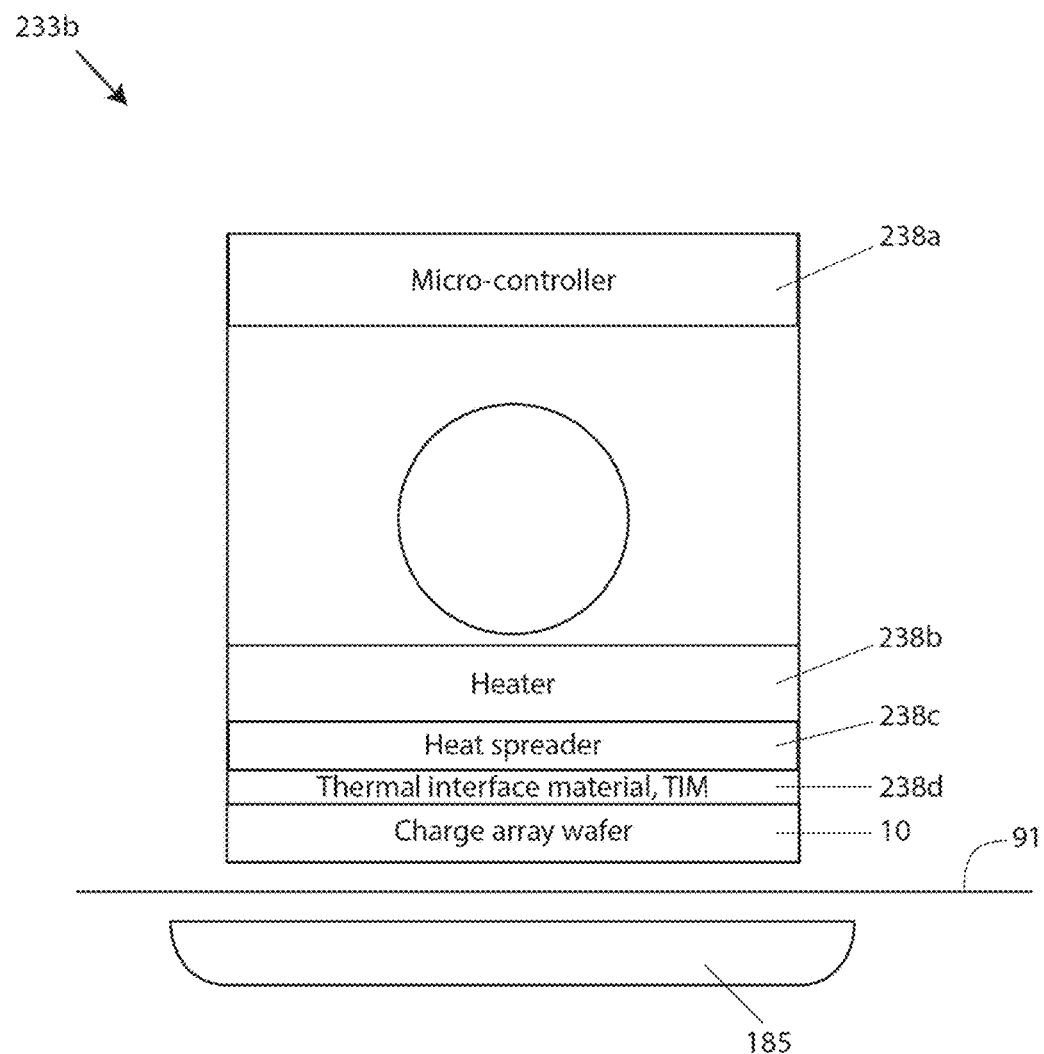
FIG. 23C is a cross-sectional view of a charge array wafer assembly that includes a heating element, in relation to a target substrate and a transfer electrode.

FIG. 23C depicts a charge wafer assembly 233b that is configured for applying heat to deposition material, and can be used in embodiments of the present invention to effect fusing of low temperature materials while both the imaging forces of the charge array wafer 10 and the transfer forces associated with transfer electrode 185 are simultaneously in effect. This arrangement may be particularly effective in creating uniform lines of fused deposition material on a target substrate. Other geometries of deposited material, or un-deposited material such as contact openings may also be accurately defined using this technique. Assembly 233b is preferably provided with a local controller 238a, to provide reliable control of the rate of heating of wafer 10, so as to reliably operate at a specified maximum junction temperature. A typical maximum junction temperature may be in the range of 150-200° C. It is possible that this temperature range can be extended by judicious design of charge array wafers 10. Also, if the heating cycles are brief and well controlled, and presuming that any potential damage to the wafer is cumulative over time, it is possible that a limit on the junction temperature of around 250° C. may be acceptable for these brief periods, allowing for a greater range of deposition materials to be used. A heating stack is shown comprising heater 238b, heat spreader 238c, thermal interface material, TIM, 238d, and charge array wafer 10. Using good thermal design practice known in the art, hot spots on wafer 10 can be avoided. Target substrate 91 is also shown, with transfer electrode 185 positioned opposite charge array wafer 10 and underneath substrate 91. For quick stabilization of an elevated fusing temperature, as well as for increasing the temperature environment for effective fusing of the deposition material, electrode 185 may also be heated during the fusing cycle. Such strategies may allow for use of solder Sn99.3Cu0.7 as a deposition material for example, having a melting point of 227° C.

Transport of target substrate 91 preferably occurs between index marks that comprise pre-embedded charges, and are detected by sensors (not shown) provided adjacent target substrate 91. Sensors may also be used to detect a "lock" when precision alignment has been achieved.

FIG. 24A depicts a pair of in-line miniaturized deposition modules 240a. The first module is configured for depositing dielectric material using material source 140, previously described in reference to FIG. 14. The second module is configured for depositing conductive material using material source 150, previously described in reference to FIG. 15. Each of the modules incorporates charge wafer assembly 233b for patterning the deposition material, and includes the capability of applying heat, as described in reference to FIG. 23C. This arrangement of modules is even more compact than can be achieved with module 230, described in reference to FIG. 23A, because the heating function of the finishing station has been integrated with wafer assembly 233b, and a separate finishing station, alternatively described as a finishing module, is no longer required. It can be seen in the figure that deposition particles have been attracted to the charge array wafers, in accordance with their programmed charge image.

FIG. 24B shows the transfer step of the deposition process, after wafer assembly 233b has been translated and rotated in order to position each of the charge array wafers in close proximity and approximate alignment with corresponding features embedded in target substrate 91. Precision alignment using active registration will preferably occur before a transfer voltage is applied. Urged by the presence of voltages applied to transfer electrodes 185(1) and 185(2), the attracted particles have been transferred to target substrate 91 as shown. After this transfer, the particles can be heated by wafer assemblies 233b(1) and 233b(2) to fuse them to substrate 91.

A simplified interpretation of the processes discussed in reference to FIGS. 24A and 24B is that each station provides the equivalent of a stamped deposit, creating a new deposition layer that is accurately formed and precision aligned to any underlying layers on substrate 91. As with a stamp, each station can be compact, and the transport of substrate 91 can be paused while the stamping occurs. In addition to the charged alignment features previously discussed, index marks comprising embedded electrical charge can be utilized to assist in providing accurate registration of each stamp to the underlying material; for example, they may be used to signal the mechanical transport system to start and stop. The index marks may be detected by sensors (not shown) provided adjacent substrate 91. Other sensors may also be used to detect a "lock" when precision alignment has been achieved at a particular station.

The deposition method that corresponds with the arrangement of modules shown in FIGS. 24A and 24B requires lower temperature deposition materials than can be accommodated with a specialized finishing station, as in module 230, because of the maximum junction temperature limitation of the charge array wafer 10 mounted in assembly 233b. However, the patterning performance will be relatively more precise because, during the fusing process, both imaging forces from wafer 10 and transfer forces from electrode 185 will be simultaneously applied, while the two substrates are accurately aligned using the active registration process. Thus the molten depositions will spread in accordance with the associated charge images programmed into the charge array wafers, and also will transfer to the target substrate rather than stick to the charge array wafers. Rejection of fused material from the surface of a charge array wafer can be enhanced by using a surface coating on the wafers that has a low surface energy; for example, PTFE, otherwise known as TEFLON may be used as a non-stick coating. If the transfer efficiency is not adequate to prevent accumulation of unwanted deposition material on the wafers, a cleaning cycle may be introduced, as performed in electrophotography with regard to unwanted toner deposits on the photoconductive drum.

Figure 24C:
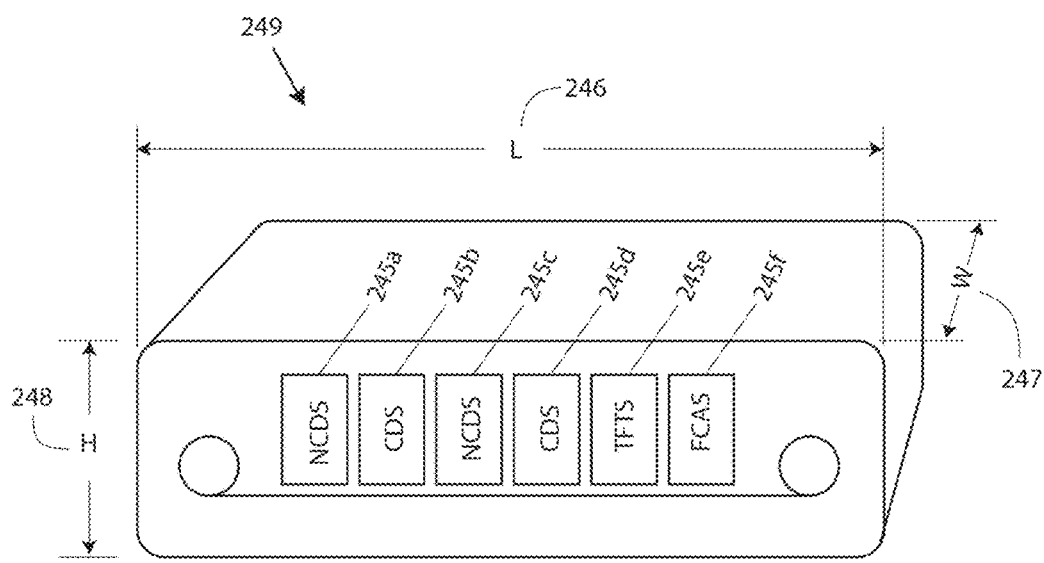
FIG. 24C is a side view of an exemplary miniaturized manufacturing system of the present invention, contained within a compact vacuum chamber.

FIG. 24C depicts an exemplary embodiment of a miniaturized or compact R2R manufacturing system 249 of the present invention. The following definitions are employed: NCDS=Non-conductive deposition subsystem, 245a and 245c; CDS=Conductive deposition subsystem, 245b and 245 d; TFTS=Thin film transistor subsystem, 245e; and FCAS=Flip chip attach subsystem, 245f. Because the various modules or subsystems have been miniaturized, manufacturing system 249 has a small volume. For example, L 26 may be around 2m, W 247 may be around 0.25m, and H 248 may be around 0.25m, resulting in a volume of around 0.13 m$^3$. This volume is sufficiently small that a commercial vacuum chamber may be provided having fast pumping times and moderate cost. Since in the evolution of the proposed technology it is generally easier to develop deposition materials and processes that assume a vacuum environment, manufacturing systems like 249 may be deployed first in a vacuum environment. Over time, as materials are developed that can tolerate ambient conditions other than vacuum, higher volume systems like system 180 described in reference to FIG. 18 may be deployed.

Figure 25:
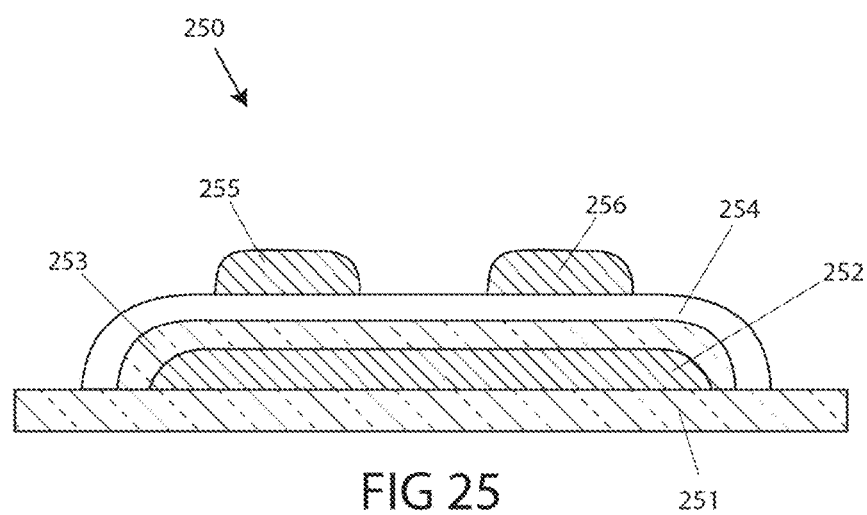
FIG. 25 is a cross-sectional view of a thin film transistor, according to an embodiment of the present invention.

FIG. 25 depicts an exemplary thin film transistor TFT structure that may be fabricated using embodiments of the manufacturing systems described herein. Dielectric base layer 251 is shown. Gate material 252 is patterned as shown, then dielectric material 253, semiconductor material 254, and source and drain materials 255 and 256. Metal oxides have been proposed as the semiconductor material. Combustion processing may be used for improved transistor performance, as detailed by Myung-Gil Kim et. al, and this processing is temperature compatible with a polyimide substrate. Other TFT structures may be employed.

Figure 26:
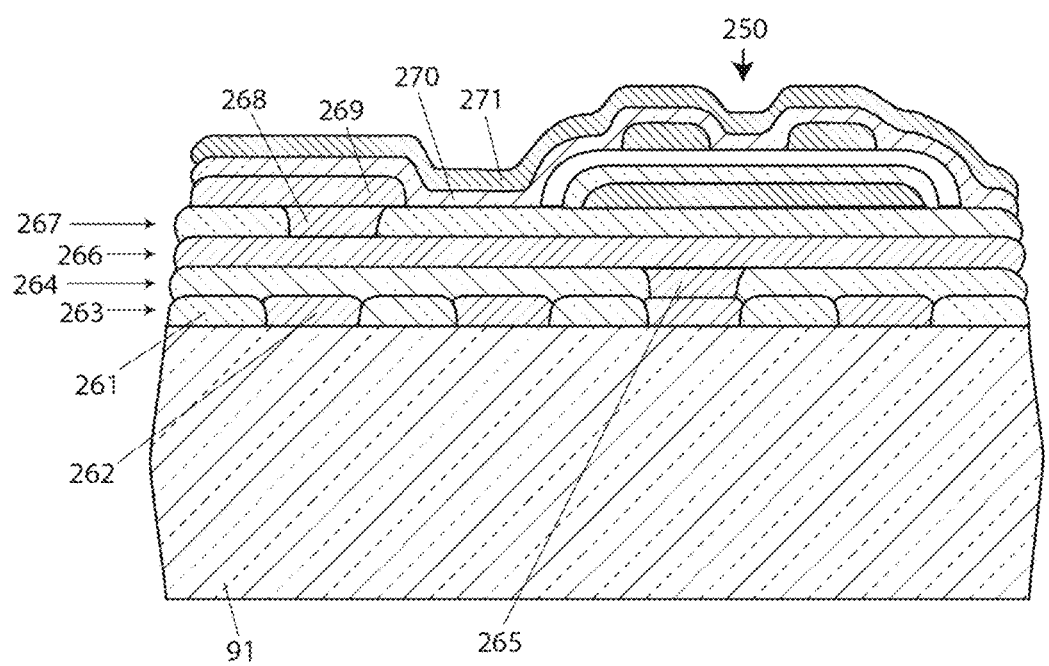
FIG. 26 is a cross-sectional view of exemplary deposition materials deposited as functional layers on a target substrate according to an embodiment of the present invention.

FIG. 26 is a cross-sectional view of deposition materials deposited as functional layers on a target substrate according to an embodiment of the present invention. Referring to FIG. 26, target substrate 91 supports a plurality of separate deposits.

FIG. 26 illustrates a product strategy of providing fine-line interconnections as the first layers deposited on target substrate 91. Thus the features with the finest dimensions may be provided on a planar substrate, or on a layered surface that is approximately planar. The first deposition may comprise dielectric stripes such as 261. The second deposition may comprise intervening stripes 262 of conductive material that have been aligned to the dielectric stripes.

Thus layer 263 may comprise a dense interconnection layer comprising parallel stripes of conductive material, say in the x-direction. Layer 264 may be a dielectric isolation layer, with feedthroughs such as 265 provided. Layer 266 may contribute a similar construction of intervening dielectric and metal stripes, but in a direction orthogonal to the stripes of layer 1, say in the y-direction. Feature 269 may be a power bus. Structure 250 may comprise a power transistor, as described in reference to FIG. 25. Layer 270 may be a passivation layer, and layer 271 may be a further protective layer or a non-stick layer as previously described. If layer 271 is a metal, it may provide superior protection against water contamination and oxidizing agents. For example, layer 271 may cover all of the active circuits, with openings only at input/output pads. A metal layer may be used for its barrier properties, and this layer may subsequently be covered with a non-stick layer for example.

Each of the separate deposits may be of a different material type, including conductive, dielectric, resistive, magnetic, optical and semiconductor as non-limiting examples. There are few limits on the selection and placing of different materials. As an example of an advantage using the proposed method versus using a conventional printed circuit board, consider that an inductor design may have an integrated structure comprising both copper conductors and iron, with thin dielectrics in between, instead of requiring the attachment of a discrete component. This is an example of an integrated passive device. Furthermore, integration of active devices such as TFTs may lead to integrated electronic systems having compact size, light weight, novel form factors, and high performance. In addition, they may be low in cost and available with short development times.

FIG. 27 depicts a flow chart that represents an exemplary method, according to an embodiment of the present invention. The method is for creating a patterned layer of deposition material on a target substrate, and comprises the following process steps: providing a target substrate having substrate alignment features comprising embedded electrical charges 271; providing a source of deposition material comprising electrically charged or bipolar particles 272; providing a charge array wafer having programmable electrical charge storage cells for creating a predetermined charge image at a central portion of the wafer area, and also for creating predetermined wafer alignment features at the wafer periphery that match the substrate alignment features 273; providing a protective circuit structure coupled to the electrical charge storage cells wherein a predetermined electrical field coupled to the predetermined charge image penetrates the top surface of the charge array wafer 274; providing a transfer unit 275; presenting the charged or bipolar particles to the top surface of the charge array wafer 276; attracting the charged particles to the top surface of the charge array wafer in accordance with the predetermined charge image 277; positioning the top surface of the charge array wafer adjacent the top surface of the target substrate in approximate alignment 278; aligning the top surface of the target substrate to the top surface of the charge array wafer in precision alignment using the substrate alignment features and the matching wafer alignment features 229; and, transferring the attracted charged or bipolar particles from the top surface of the charge array wafer to the top surface of the target substrate using the transfer unit, wherein the charged particles are transferred in accordance with the predetermined charge image 280.

FIG. 28 depicts a flow chart that represents an exemplary method, according to an embodiment of the present invention. The method is for aligning two opposing substrates, and comprises the following process steps:

Providing a first substrate having substrate alignment features comprising first embedded electrical charges in a first pattern 291; providing a second substrate having substrate alignment features comprising a second pattern matching the first pattern, except for having opposite electrical polarities to the first embedded electrical charges 292; aligning the first and second substrates to a first alignment accuracy using a mechanical transport system, wherein a loose draping allows small local movements between the first and second substrate 293; providing a modulating electrode 294; positioning the modulating electrode underneath the second substrate 295; connecting an AC voltage to the modulating electrode, in series with any applied DC voltage 296; determining the total force of steady state adhesion between the first and second substrates, at the point in time when precision alignment is desired 297; controlling the AC voltage as a decaying sinusoid to provide a modulated lateral alignment force between the first and second substrates, wherein the amplitude of the sinusoidal waveform is sufficient to provide a modulated lateral alignment force that in the initial cycles overcomes the value determined for the steady state adhesion, including any stiction 298; and, aligning the first and second substrates to a second alignment accuracy higher than the first alignment accuracy using the substrate alignment features and the modulated lateral alignment force.

The use of a decaying sinusoidal waveform as the AC voltage temporarily decouples the adhesion forces between the first and second substrates, allowing the alignment features to exert restoring lateral forces that move the substrates into accurate alignment. After the first small movement to improve local alignment, successive movements become smaller and smaller, until only the steady state adhesion remains to retain the substrates in precise alignment.

TABLE 1

| Deposition Species | Pixel Size | Surface Potential (between adj. pixels) |
| --- | --- | --- |
| Gas molecules | 1 × 1 μm | 10 V |
| Encapsulated particles | 5 × 5 μm | 50 V |
| Print toner | 10 × 10 μm | 100 V |

Table 1 illustrates flexible uses of the proposed charged array wafers, and the same flexibility extends to deposition modules and manufacturing systems. Let's assume that after considering the desired range of deposition materials, the ability to provide them with an appropriate charge or bipolar characteristic, and the desired spatial resolution of a stacked layer product, a manufacturing company settles on an edge dimension of 1 μm for the charge storage cells. The company may test a lot of charge array wafers and determine that 30% of them have no defective cells. Thus these high quality wafers may be assigned to patterning webs used in deposition modules that pattern material in the form of gas ions or polarized gas molecules. Other wafers may have isolated defective cells but no pairs or higher order groups where adjacent cells are defective. These medium quality wafers may be assigned to patterning webs used in deposition modules that employ 5×5 micron pixels; in this case a single defective cell may not have an intolerable effect on the patterned feature, especially if the patterned feature is to be a deposition rather than a contact opening for example. The difference in surface potential ϕs between adjacent pixels required to form a charge image effective for gas molecules will typically be lower than the surface potential difference required for five-micron diameter charged particles. Similarly, if a print toner has an average diameter of ten microns, it will typically require a higher voltage for imaging than the five micron particles, or the much smaller gas molecules. Table 1 summarizes these anticipated results and reveals that a single standardized design of a charge storage element, a charge array wafer, and a deposition module can accommodate a wide range of deposition materials using configuration software. The configuration software may be implemented as a routine that is executed prior to a production run, optimizing each of the deposition modules in accordance with the predetermined deposition material for the associated module. The optimization includes setting a pixel size, and also setting predetermined voltages to be used for programming the charge storage cells. The predetermined voltages may be provided by programmable power supplies that are internal or external to each deposition module.

TABLE 2

| Attribute | Custom Silicon Wafer | Proposed Flexible System Product |
|---|---|---|
| Minimum feature size | 28 nm | 5 μm [1] |
| Substrate | silicon | polyimide |
| Diameter | 200 mm | 200 mm |
| Non-refundable engineering cost | $70M | $6,000 [2] |
| Unit manufacturing cost | $20k | $10 [3] |
| Lead time for new design | 2 months | a few hours |
| Lead time for additional production units | 1 month | a few hours |
| Level of integration | Medium [4] | High [5] |

[1] Assumes width dimension of charge storage cells is 1 μm
[2] 12 hours technician time to program charge array wafers and setup system
[3] 12 patterning/finishing steps, 20 cents per square inch, cost of attached chips not included
[4] Typically does not include embedded passives or power devices
[5] Includes high speed interconnects, novel structures, passives, power devices, and flip chips Table 2 is provided to compare the attributes of a product built using an embodiment of the present invention with a custom silicon wafer, according to the five assumptions listed. It is clear that substantial advantages pertain to the proposed flexible system product.

TABLE 3

| Product Attribute | PCB | NuTech | Chip |
|---|---|---|---|
| Substrate | FR-4 | Polyimide | Silicon |
| Process | Batch | Continuous R2R | Batch |
| Avail. Substrate area | ~1200 sq cm | ~200 sq cm | ~1 sq cm |
| Line/Space (μm) | 100/100 | 5/5 | .01/.01 |
| Time for design turn | ~1 week | A few hours | ~2 months |
| Interconnect speed | Low | Medium | High |
| System cost | Medium | Low | High |
| System Integration level | High | Highest | Low |

Table 3 provides a comparison between product attributes of a conventional printed circuit board, PCB, an integrated circuit chip, and a product labeled NuTech produced using an embodiment of a manufacturing system described herein. The table serves to summarize a number of critical issues pertaining to fabrication of modern electronic systems.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A charge array wafer comprising:
   a support wafer having a backside and including a plurality of first electrical charge storage cells disposed in an array configuration and above the backside; and
   a plurality of circumferentially arrayed electrical charge storage cells peripherally surrounding the plurality of first electrical charge storage cells and configurable as alignment features;
   wherein each of the plurality of first electrical charge storage cells includes:
      a charge storage layer disposed in a first plane positioned at a first distance from the backside; and
      a passivation layer coupled to the charge storage layer and disposed in a second plane positioned at a second distance from the backside greater than the first distance, the passivation layer having a bottom surface coupled to the charge storage layer and a top surface opposite the bottom surface;
   wherein the top surface of the passivation layer is operable to receive deposition materials; and
   wherein each of the plurality of first electrical charge storage cells is programmable to create a predetermined electric field extending from the charge storage layer through the top surface of the passivation layer.

2. The charge array wafer of claim 1 wherein the array configuration of first electrical charge storage cells comprises an uninterrupted two-dimensional array extending over greater than 100×100 first electrical charge storage cells without a select gate and without a bit-line contact positioned between any of the first electrical charge storage cells making up the uninterrupted two-dimensional array.

3. The charge array wafer of claim 1 wherein each first electrical charge storage cell comprises a control gate operable for programming the first electrical charge storage cells, and wherein the control gate is disposed between the charge storage layer and the passivation layer.

4. The charge array wafer of claim 1 wherein a voltage used to program the first electrical charge storage cells varies from about 10V to about 100V.

5. The charge array wafer of claim 1 wherein each of the plurality of first electrical charge storage cells is characterized by an edge dimension and wherein each of the plurality of first electrical charge storage cells is operable to be programmed using a two-dimensional block size corresponding to a pixel of a charge image, wherein an edge dimension of the pixel is a multiple of the edge dimension of each of the plurality of first electrical charge storage cells.

6. The charge array wafer of claim 1 wherein the deposition material comprises a gas, a liquid, or a powder.

7. The charge array wafer of claim 1 further comprising a plurality of through wafer vias disposed at a periphery of the support wafer.

8. The charge array wafer of claim 1 wherein the deposition materials have a minimum feature size ranging from tens of nanometers to around 5 μm.

9. The charge array wafer of claim 1 wherein the deposition materials are electrically charged, or electrically polar.

10. A charge array wafer comprising:
   a support wafer having a backside and including a plurality of first electrical charge storage cells disposed in an array configuration above the backside, each of the plurality of first electrical charge storage cells comprising:

a charge storage layer disposed in a first plane positioned at a first distance from the backside; and a passivation layer coupled to the charge storage layer and disposed in a second plane positioned at a second distance from the backside greater than the first distance, the passivation layer having a bottom surface coupled to the charge storage layer and a top surface opposite the bottom surface configured to receive deposition materials, wherein each of the plurality of first electrical charge storage cells is programmable to create a predetermined electric field extending from the charge storage layer through the top surface of the passivation layer; and wherein the array configuration of first electrical charge storage cells comprises an uninterrupted two-dimensional array extending over greater than 100×100 first electrical charge storage cells without a select gate and without a bit-line contact disposed between any of the first electrical charge storage cells making up the uninterrupted two-dimensional array.

11. The charge array wafer of claim 10 wherein each of the plurality of first electrical charge storage cells comprises embedded electrical charges.

12. The charge array wafer of claim 10 further comprising a plurality of circumferentially arrayed electrical charge storage cells peripherally surrounding the plurality of first electrical charge storage cells and configurable as alignment features.

13. The charge array wafer of claim 12 wherein each of the plurality circumferentially arrayed electrical charge storage cells comprises embedded electrical charges.

* * * * *